United States Patent
Levy

(10) Patent No.: US 10,417,094 B1
(45) Date of Patent: Sep. 17, 2019

(54) HYPER STORAGE CLUSTER

(71) Applicant: Peer Fusion, Inc., Milpitas, CA (US)

(72) Inventor: Richard S. Levy, Milipitas, CA (US)

(73) Assignee: Peer Fusion, Inc., Milpitas, CA (US)

( * ) Notice: Subject to any disclaimer, the term of this patent is extended or adjusted under 35 U.S.C. 154(b) by 0 days.

(21) Appl. No.: 15/649,536

(22) Filed: Jul. 13, 2017

Related U.S. Application Data

(60) Provisional application No. 62/361,996, filed on Jul. 13, 2016.

(51) Int. Cl.
  *G06F 11/10* (2006.01)
  *H03M 13/15* (2006.01)
  *H03M 13/09* (2006.01)

(52) U.S. Cl.
  CPC ....... *G06F 11/1092* (2013.01); *H03M 13/096* (2013.01); *H03M 13/1515* (2013.01); *G06F 11/1076* (2013.01)

(58) Field of Classification Search
  CPC ............ G06F 11/1092; G06F 11/1076; H03M 13/096; H03M 13/1515
  USPC .................................................. 714/758, 764
  See application file for complete search history.

(56) References Cited

U.S. PATENT DOCUMENTS

| | | |
|---|---|---|
| 5,588,121 A | 12/1996 | Reddin et al. |
| 5,636,355 A | 6/1997 | Ramakrishnan et al. |
| 5,893,139 A | 4/1999 | Kamiyama |
| 6,029,168 A | 2/2000 | Frey |
| 6,081,907 A | 6/2000 | Witty et al. |
| 6,173,374 B1 | 1/2001 | Heil et al. |
| 6,678,828 B1 | 1/2004 | Pham et al. |
| 6,928,578 B2 | 8/2005 | Archibald, Jr. et al. |
| 6,934,904 B2 * | 8/2005 | Talagala ............... G06F 11/1076 714/770 |
| 7,287,180 B1 | 10/2007 | Chen et al. |
| 7,328,386 B2 * | 2/2008 | Grinchuk ....... G01R 31/318547 714/726 |
| 7,412,433 B2 | 8/2008 | Anglin et al. |
| 8,370,715 B2 * | 2/2013 | Hafner ................ G06F 11/1076 714/769 |
| 8,626,820 B1 | 1/2014 | Levy |
| 8,949,691 B2 * | 2/2015 | Shinohara ............. H03M 13/13 714/752 |

(Continued)

OTHER PUBLICATIONS

Lawler, S., "Active/Active Controller Configuration Overview and Best Practice Guidelines—FAS Systems with Data ONTAPâ 7G," Network Applicance, Inc., Jan. 2007, 21 pp.

(Continued)

*Primary Examiner* — James C Kerveros
(74) *Attorney, Agent, or Firm* — Haynes Beffel & Wolfeld LLP

(57) ABSTRACT

A highly resilient, scalable, high-performance data storage system that stripes its content across peer computers in a data cluster, across data clusters in a cluster group, and across cluster groups in a multi-cluster-group Hyper Storage System. Multiple peers can fail within a data cluster, even beyond the FEC level configured in the cluster, without disrupting the clients. Multiple entire data clusters can fail or be taken out of service without disrupting the clients. Peer failures are detected by the cluster and all missing data is seamlessly regenerated through vertical and/or horizontal resiliency so the great majority of I/O operations complete successfully.

23 Claims, 13 Drawing Sheets

(56) References Cited

U.S. PATENT DOCUMENTS

| | | |
|---|---|---|
| 9,372,870 B1 | 6/2016 | Levy |
| 2001/0012442 A1 | 8/2001 | Kodama |
| 2002/0131423 A1 | 9/2002 | Chan et al. |
| 2002/0133491 A1 | 9/2002 | Sim et al. |
| 2002/0162109 A1 | 10/2002 | Shteyn |
| 2002/0194428 A1 | 12/2002 | Green |
| 2003/0033308 A1 | 2/2003 | Patel et al. |
| 2003/0084020 A1 | 5/2003 | Shu |
| 2003/0120723 A1 | 6/2003 | Bright et al. |
| 2003/0140207 A1 | 7/2003 | Nagase et al. |
| 2003/0233455 A1 | 12/2003 | Leber et al. |
| 2003/0236961 A1 | 12/2003 | Qiu et al. |
| 2004/0249972 A1 | 12/2004 | White et al. |
| 2005/0015460 A1 | 1/2005 | Gole et al. |
| 2005/0223102 A1 | 10/2005 | Zhang et al. |
| 2005/0273686 A1 | 12/2005 | Turner et al. |
| 2005/0283537 A1 | 12/2005 | Li et al. |
| 2006/0069800 A1 | 3/2006 | Li |
| 2006/0206889 A1 | 9/2006 | Ganesan et al. |
| 2006/0212782 A1 | 9/2006 | Li |
| 2006/0224760 A1 | 10/2006 | Yu et al. |
| 2008/0256420 A1* | 10/2008 | Hafner ............... G06F 11/1004 714/770 |
| 2008/0282298 A1 | 11/2008 | Ganesan et al. |
| 2009/0010426 A1 | 1/2009 | Redmond |
| 2015/0227419 A1* | 8/2015 | Sakaue ............... G11C 29/52 714/764 |

OTHER PUBLICATIONS

EMC2 white paper, "EMC CLARiiON High Availability (HA)—Best Practices Planning," Apr. 2007, 19 pp.

SNIA Technical Position, "Common RAID Disk Data Format Specification," Rev. 1.2 with Errata A Applied, Aug. 2007, 96 pp.

Burkhard, W.A. et al., "Disk Array Storage System Reliability," University of California, San Diego and Storage Architectures, Jul. 1993, 10 pages.

Hartman, J.H., "The Zebra Striped Network File System," Dissertation, University of California, Berkeley, 1994, 159 pages.

Mcauley, A.J., "Reliable Broadband Communication Using a Burst Erasure Correcting Code," ACM SIGCOMM '90, Sep. 1990, pp. 1-10, Philadelphia, PA.

Plank, J.S., "A Tutorial on Reed-Solomon Coding for Fault-Tolerance in RAID-Like Systems," University of Tennesee, Feb. 19, 1999, p. 1-19.

Rabin, M.O., "Efficient Dispersal of Information for Security, Load Balancing, and Fault Tolerance," Journal of the Association for Computing Machinery, Apr. 1989, pp. 335-348, vol. 36, No. 2.

Rizzo, L., et al., "Effective Erasure Codes for Reliable Computer Communication Protocols," ACM Computer Communication Review, Apr. 1997, vol. 27, No. 2, 13 pages.

Rizzo, L., et al., "RMDP: an FEC-Based Reliable Multicast Protocol for Wireless Environments", Mobile Computing and Communications Review, vol. 2, No. 2, Apr. 1998, pp. 1-10.

Rowstron, A. et al., "Storage Management and Caching in PAST, a Large-Scale, Persistent Peer-To-Peer Storage Utility," ACM, 2001, 13 pages.

Xin, Q. et al., "Evaluation of Distributed Recovery in Large-Scale Storage Systems," Proceedings of the 13th IEEE International Symposium on High Performance Distributed Computing, Jun. 2004, 10 pages, Honolulu, HI.

Sun Microsystems, Inc. white paper for Solaris ZFS™, 2008, 16 pp.

Seltzer M. et al., "A New Hashing Package for UNIX," presented at USENIX—Winter '91—Dallas, TX, 12 pp.

Hewlett Packard Administrator's Guide, VERITAS Volume Manager 3.1, for HP-UX 11i and HP-UX 11i Vrsion 1.5, Jun. 2001, 432 pp.

Litwin, W., "Linear Hashing: A New Tool for File and Table Addressing," IEEE 1980, pp. 212-223.

EMC 2 white paper, "EMC Symmetrix DMX-4 Ultra-Performance Tier 0 Using Flash Drives," Jun. 2008, 12 pp.

Tang, H. et al., "Differentiated object placement and location for self-organizing storage clusters," Technical Report 2002-32, UCSB, Nov. 2002, 14 pp.

Bakkaloglu, M., et al. "On correlated failures in survivable storage systems." Information Systems Journal May 2002, 2pp.

Wells, C., "The OceanStore archive: Goals, structures, and self-repair," U.C. Berkeley Masters Report, May 2002, 20pp.

Patterson D.A. et al., "A Case for Redundant Arrays of Inexpensive Disks (RAID)," Proceedings of the International Conference on Management of Data(SIGMOD), Jun. 1988, 25pp.

\* cited by examiner

|  | CW0 | CW1 | CW2 | CW3 | CW4 | CW5 | CW6 |
|---|---|---|---|---|---|---|---|
| Peer 0 | CSS0 | ISS0 | CSS1 | ISS0 | CSS2 | ISS0 | ISS0 |
| Peer 1 | CSS1 | ISS1 | CSS2 | ISS1 | ISS0 | CSS0 | ISS1 |
| Peer 2 | CSS2 | ISS2 | ISS0 | CSS0 | ISS1 | CSS1 | ISS2 |
| Peer 3 | ISS0 | CSS0 | ISS1 | CSS1 | ISS2 | CSS2 | ISS3 |
| Peer 4 | ISS1 | CSS1 | ISS2 | CSS2 | ISS3 | ISS1 | CSS0 |
| Peer 5 | ISS2 | CSS2 | ISS3 | ISS2 | CSS0 | ISS2 | CSS1 |
| Peer 6 | ISS3 | ISS3 | CSS0 | ISS3 | CSS1 | ISS3 | CSS2 |

FIG. 3

|        | CW0  | CW1  | CW2  | CW3  | CW4  | CW5  | CW6  |
|--------|------|------|------|------|------|------|------|
| Peer 0 | CSS0 |      | CSS1 |      | CSS2 |      |      |
| Peer 1 | CSS1 |      | CSS2 |      |      | CSS0 |      |
| Peer 2 | CSS2 |      |      | CSS0 |      | CSS1 |      |
| Peer 3 |      | CSS0 |      | CSS1 |      | CSS2 |      |
| Peer 4 | ISS1 | CSS1 | ISS2 | CSS2 | ISS3 | ISS4 | CSS0 |
| Peer 5 |      | CSS2 |      |      | CSS0 |      | CSS1 |
| Peer 6 |      |      | CSS0 |      | CSS1 |      | CSS2 |

FIG. 13

HYPER STORAGE CLUSTER

CROSS REFERENCE TO OTHER APPLICATIONS

Applicant hereby claims the benefit under 35 U.S.C. 119(e) of U.S. provisional application No. 62/361,996, filed 13 Jul. 2016 (PEER 1003-1). The provisional application is hereby incorporated by reference in its entirety.

BACKGROUND

Field of Invention

The invention relates to a networked storage cluster capable of extensive expansion, with encoding and decoding digital content for reliable distribution and storage.

Description of Related Art

Petabytes of data require an enormous storage infrastructure made up of thousands of servers each storing a portion of the data. This magnitude of storage is needed by many modern installations, such as for streaming media servers, internet search engine databases, and large social networking services. The data stored on such systems are considered precious and must be preserved for continuous access.

The vast majority of on-line content is stored on hard disk drives (HDDs). HDDs have grown enormously in capacity over the last number of years, but they suffer from certain limitations when used to store and retrieve massive amounts of data.

First, the growth in storage capacity has far outpaced the speed at which HDDs can store and retrieve data. The asymmetry is such that entirely reading or writing a one-terabyte HDD could require days. One known solution to the problem of data storage and retrieval rates involves the use of Storage Area Networks (SANs), which were created to provide high performance Fibre networks connecting servers and large RAIDs. However, SANs are highly complex and very expensive.

Second, HDDs have reliability limitations. No matter what their Mean Time Between Failure (MTBF), HDDs can and do fail, thereby losing their contents. Powerful servers service many simultaneous data transfers and therefore would be impacted severely if they become unavailable. A server failure will cause immediate disruptions. Redundancy is often added to servers to address this problem. RAID (Redundant Array of Independent Disks) is an example of a redundancy configuration intended to improve reliability. In a RAID, the loss of a single member of a disk group will not interrupt the operation of the RAID, though it does impact response time as the RAID controller needs to retrieve all the remaining data blocks of a codeword individually and then mathematically regenerate the missing data block. Also, while the RAID controller can rebuild the data that belongs on the failed disk when it is replaced with a new (empty) disk, this is an operation that can take several hours depending upon the size of the disk and the how busy the RAID is. In addition, starting from the time the disk failure was first detected and until the time the replacement disk is rebuilt, the RAID is said to be "naked". The term "naked" indicates that the RAID no longer offers any protection, as the loss of a second member of the disk group is fatal to the RAID since it is incapable of correcting more than one failure. Other versions of RAID exist which can tolerate two or more disk failures, but at some point the RAID will become naked.

Many large and well-known internet-based systems with very large data requirements address the reliability problem by completely replicating all the data, some even replicating it twice. This is a very expensive solution that requires three times the capital expenditure, floor space, power and cooling. This solution also requires the added time necessary to replicate data as it is ingested. And it is not easily scalable for still further data protection, since adding even one more copy of the data requires a huge capital outlay, with almost no realizable economies of scale.

In addition to redundancy in the HDDs themselves, server sub-systems too are often made redundant by duplicating their major components, including host bus adapters (HBA), RAID controllers, CPUs, network interfaces, memory, routers, switchers, power supplies, etc. SANs have the same reliability requirements so they too are typically made redundant which requires cross strapping of all the connecting cables from all the servers, RAID's, SAN's, etc. For all this added hardware, however, many servers and SANs still provide protection for only a single failure; a second failure within the same sub-system usually will still cause disruptions. Most fully redundant systems still cause disruptions during the time when their failed components are being repaired or replaced (e.g., a memory bank, CPU or I/O controller are being replaced). In addition, the failed components must be repaired as soon as possible because their unavailability increases the vulnerability of the systems. Thus even fully redundant systems do not eliminate disruptions on failures; they simply afford some flexibility to schedule when the disruption will occur.

In U.S. patent application Ser. No. 14/148,575, filed 6 Jan. 2014, entitled PEER TO PEER CODE GENERATOR AND DECODER FOR DIGITAL SYSTEMS AND CLUSTER STORAGE SYSTEM, by inventor Richard S. Levy (PEER 1001-4, "the '575 application"), incorporated herein by reference for its teachings, methods and systems are described in which data are striped across multiple peer computer systems in a cluster. A unique implementation of Forward Error Correction (FEC) provides redundancy for any desired number of peer failures, covering both HDD failures and whole server failures, at far less capital investment than duplicating or tripling the system's total storage capacity. In various embodiments, should one or more peer fail, the remaining peers in the cluster can remedy the failure on-the-fly. Embodiments of the system are inherently able to withstand multiple concurrent failures as well as having repairs performed while operational without disruptions. Compute-intensive operations such as generating checksum symbols and reconstructing missing data symbols can be spread among peers that are still operational, thereby minimizing the impact on any one of the peers and eliminating the bottleneck that a RAID-like implementation might create by assigning the computational responsibility to a central gateway or controller.

The solutions described in the above-incorporated patent application are highly effective. the following discussion describes ways to scale such systems for very large server clusters with thousands of peers. The technology described herein is able to store massive amounts of data, with excellent reliability and availability, without having to rely on expensive SANs or complete duplicate or triplicate copies of the data. An opportunity therefore arises to create a robust solution to the problems of massive data storage and retrieval. Better computer systems, with higher capacity, higher performance and lower cost may result.

SUMMARY

Roughly described, the invention involves a method of storing and retrieving data in a clustered data processing system having M data clusters and K checksum clusters, the M data clusters themselves having P peers and protection against multiple simultaneous peer failures. Write date is divided into segments that are stored in vertical stripes in the data clusters of the cluster group, and vertical checksums are generated and stored in the data cluster as well. Horizontal checksums are also generated and stored in the checksum clusters of the cluster group, in corresponding peers. If a destination peer in a destination data cluster has failed, the data can still be stored in the cluster group in a retrievable and error correctable manner by using the vertical codeword to regenerate prior missing data, and then updating both the appropriate vertical and horizontal checksum peers using the write data and the regenerated missing data; the write data itself need never be stored. If the number of failed peers in the destination data cluster exceeds its FEC level, then the data can still be stored in the cluster group in a retrievable and error correctable manner by using the horizontal codeword to regenerate prior missing data, and then updating the appropriate horizontal checksum peers using the write data and the regenerated missing data. If one or more peers storing data for the horizontal codewords has failed, then the data cluster containing that peer regenerates it and transmits it as needed.

For data retrieval, if the peer in the data cluster responsible for returning a segment of requested data is unavailable, that data is regenerated by the other peers in the same data cluster using the vertical codeword that includes the missing data segment. If the number of failed peers in that data cluster exceeds its FEC level, then a peer in an appropriate one of the checksum clusters regenerates the missing data using the horizontal codeword that includes the missing data segment. And if one or more peers storing data for the horizontal codewords has failed, then the data cluster containing that peer regenerates it and transmits it as needed.

The checksum clusters too can form their own vertical codewords for protecting and regenerating horizontal checksums on failed checksum cluster peers when needed.

The group of M data clusters and K checksum clusters forms a cluster group that can store petabytes of data in highly resilient manner. Through the use of a specialized multicast burst protocol in which all relevant peers see all relevant data segments transmitted or received by other peers, and a consistent algorithm that each peer uses to determine for itself what its responsibility is in response to a particular read or write request, as adjusted in accordance with known peer failures, performance is multiplied rather than bottlenecked with increasing numbers of data clusters and peers per data cluster. Moreover, multiple cluster groups can be assembled together into a Hyper Storage System, in which a gateway system receives read and write requests from client computer systems, divides them into chunks each covering data reads or writes to a single one of the cluster groups, and forwards each to the appropriate cluster group for distributed processing.

The above summary of the invention covers only some aspects of the invention, and is provided in order to provide a basic understanding of such aspects. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which:

FIG. 3 illustrates the rotational assignments in an embodiment of a data cluster of FIG. 2.

FIG. 13 illustrates an arrangement of data blocks and checksum blocks where a data write request specifies a target peer.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
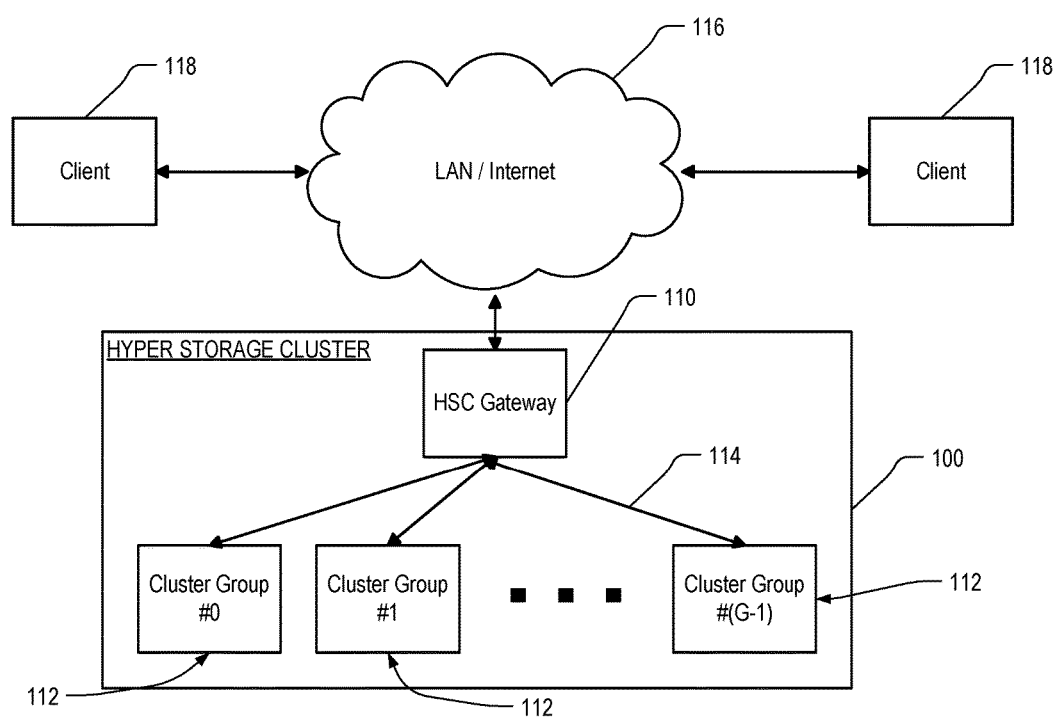
FIG. 1 is a block diagram of a hyper storage cluster (HSC) 100 incorporating aspects of the invention.

FIG. 1 is a block diagram of a hyper storage cluster (HSC) 100 incorporating aspects of the invention, in context with clients who make storage and retrieval requests to the HSC 100. The HSC has one or more HSC gateways 110, which communicate with G cluster groups (CG's) 112 via a network 114. For example, the network 114 may be an Ethernet-based network which preferably uses IP as its network layer protocol. Alternatively, the network may be any other appropriate network type such as Infiniband. Socket-based protocols are preferred, but they do not necessarily have to rely on IP. Though not shown in FIG. 1, the network 114 can include intervening switches and routers, and parts of it can include the Internet. The cluster groups are numbered in the drawing as cluster group #0 through cluster group # (G-1).

The HSC gateway 110 also communicates via a network 116 with one or more client computer systems 118. As with network 114, network 118 may be an IP network which may include intervening switches and routers and the Internet. In one embodiment, network 114 and network 118 are the same network. In operation, client computer systems 118 make storage and retrieval requests, as well as file management requests, via network 116, to the HSC 100. HSC 100 stores data in files in accordance with a filesystem exposed to the clients 118. The HSC gateway 110 distributes portions of the files among its cluster groups 112 according to its own internal rules, except that in certain embodiments the clients 118 can make specific storage location requests as described hereinafter.

Figure 2:
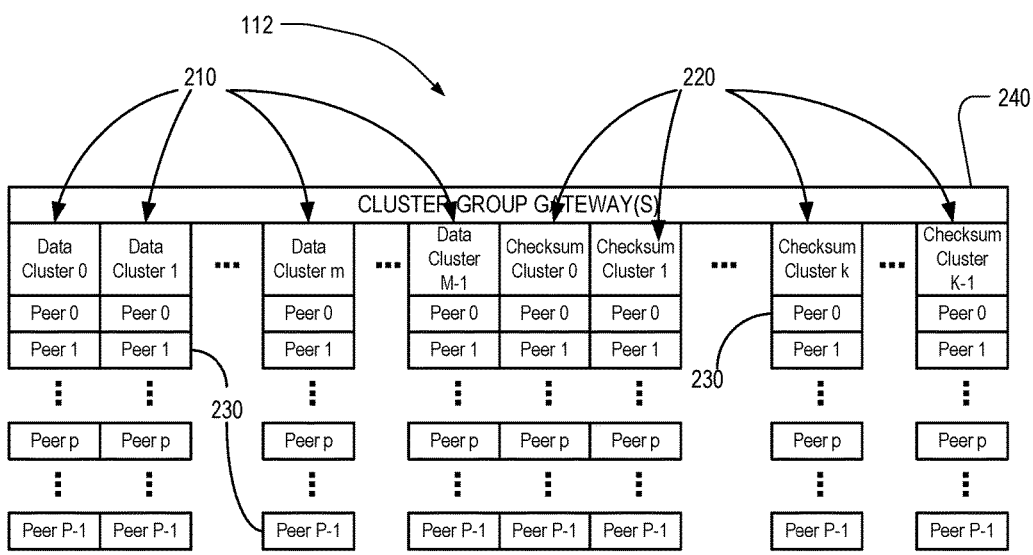
FIG. 2 is a block diagram of a cluster group of FIG. 1 in accordance with aspects of the invention.

FIG. 2 is a block diagram of a "cluster group" 112 in accordance with aspects of the invention. It is constructed by aggregating a large number of storage clusters each as described in the above-incorporated patent application. As shown in FIG. 2, the cluster group includes both data clusters (DC's) 210 and checksum clusters (CC's) 220. There are a number M≥1 data clusters, numbered in FIG. 2 as data cluster #0 through data cluster #(M−1), and K≥1 checksum clusters, numbered in FIG. 2 as checksum cluster #0 through checksum cluster #(K−1). As used herein, both data clusters and checksum clusters are considered kinds of "storage clusters" (SC's). Each storage cluster contains a number P>1 storage peers 230, which are servers that include high-bandwidth networking, CPU, RAM and storage capacity (e.g. HDDs, SSDs, etc.). The peers are numbered in FIG. 2 as peer #0 through peer #(P−1).

As an example, though there can be many different configurations, in one embodiment a single storage cluster is contained in a standard full-size 80 U rack, containing 40 2U peers or 80 1 U peers. Within such a cluster resiliency can be ensured for any number F<P simultaneous peer failures. Resiliency can be provided by any encoding solution, but the embodiment of FIG. 2 uses Reed-Solomon (RS) encoding. Thus for example, for protection against 4 simultaneous peer failures in a cluster, RS coding with an FEC level of 4 can be used. That is, a RS codeword may contain 36 data blocks and 4 checksum blocks and we denote this as a 40:36 cluster. The protection afforded by RS coding within a single cluster is sometimes referred to herein as "intra-cluster" resiliency or "private" resiliency, since with up to the designed number of peer failures, there is no need to look outside the cluster to regenerate missing data blocks. Intra-cluster resiliency is also sometimes referred to herein as "vertical" resiliency, in keeping with the physical arrangement of an embodiment having a rack with the peers stacked vertically and each peer contributing segments to form codewords. The codewords are also referred to sometimes herein as being "vertically" striped. The term "vertical" is used herein only as a logical arrangement, in contradistinction to "horizontal" (discussed below), since there is no requirement that the peers actually be disposed vertically with respect to each other. Also as used herein, "protection" against some number F peer failures refers to the ability to correct for F peer failures, not merely to detect them.

In some embodiments, each cluster group 112 also may include one or more cluster group gateways 240 as described below.

A file of data stored in the HSC 100 is stored as a set of one or more codewords, each containing a number of data segments equal to the number of peers P in a data cluster 210 of the target cluster group 112. The data segments include P-F "Input Symbol Segments" (ISS's) and F "Checksum Symbol Segments" (CSS's), where F is the designed FEC level of a data cluster 210. In the term "Input Symbol Segment", a "symbol" for example may be an 8-bit byte. Adding the word "segment" means an ISS can include many consecutive "symbols". Preferably, an ISS has a length equal to the data carrying capacity of a packet in the network 114, which in the case of an IP network, is 8 k bytes.

As used herein, the term "data" includes both input symbols and checksum symbols, as well as nulls. A "data segment" thus is a segment of "data", and could include ISS's and/or CSS's. A full file is an example of a data segment, as is a data set which is smaller than a full file, as is a data block and an ISS. As used herein the term "data segment" by itself carries no implication of length, contiguity or granularity, though restrictions on those attributes may be implied by the context. For example, an ISS is a kind of "data segment", but it is further restricted for example in that all the symbols that it contains are contiguous.

A "codeword", as used herein, is a data segment of contiguous ISS's, plus all the CSS's covering them vertically. The number of CSS's is defined by the FEC of the particular embodiment, and in the embodiments described herein, the total length of a codeword is equal to the number of peers in a data cluster, P. Since codewords are "striped" across the peers of a data cluster vertically, a "codeword" is also sometimes referred to herein as a vertical "stripe" once stored on a data cluster. A CSS or other checksum is considered herein to "cover" or "protect" a particular data segment if the contents of the CSS can be used to help recover the particular data segment if lost. If a CSS is said to "cover" or "protect" some data segments, that does not exclude that it may "cover" or "protect" other data segments also. As will be seen, embodiments of the invention use error correction coding also in the "horizontal" dimension, i.e. across clusters in a cluster group. Like vertical codewords, horizontal codewords also include data segments plus at least one checksum segment protecting the data segments horizontally. Horizontal codewords differ from vertical codewords at least in that ISS's in a vertical codeword are contiguous as viewed from outside the data cluster, whereas in a horizontal codeword the protected ISS's typically are not contiguous. The discussion herein uses the term "codeword" to cover both vertical and horizontal codewords, and refers to "vertical" or "horizontal" codewords specifically when necessary to distinguish between them.

Embodiments of the present invention maximize the performance of the encoding and decoding computation by evenly distributing the workload among peers using a rotational algorithm. The algorithm generates a cycle of codeword encoding/decoding patterns that can be used to distribute the codec workload evenly across the peers 230 in a cluster. The algorithm takes as configuration parameters the count of peers 230 actively participating in a particular transaction (e.g. a read or write), and the count of checksum segments per codeword (the FEC level). The latter count corresponds to the maximum number of tolerable peer failures when storing data or the actual number of failed peers when retrieving data. When storing data, the current rotation pattern is known and used by each of the peers 230 in a data cluster 210 to determine, for a given codeword number, whether to encode and store a checksum segment, or whether to just store an input symbol segment, and which input symbol segment to store. When retrieving data, the current rotation pattern is known and used by each of the peers 230 to determine for a given codeword number whether to provide its data block as retrieved data, or whether to regenerate an erased ISS.

FIG. 3 illustrates the rotational assignments in an embodiment in which a codeword has length P=7, with FEC level F=3. Thus in each codeword, four data segments are ISS's, and three are CSS's. In the table of FIG. 3, seven codewords CW0-CW6 are shown. Each entry in the table marked as "ISSx", x=0, 1, 2 or 3, indicates a specific input symbol segment. On a data store, a peer assigned ISSx has the responsibility to store the x'th ISS of the incoming codeword, and on a data retrieval, a peer assigned ISSx has the responsibility to transmit the x'th ISS of the requested codeword toward the requestor. Each entry in the marked as "CSSx" (x=0, 1 or 2) indicates a checksum symbol segment.

Each checksum symbol segment CSSx is unique as each is computed with a unique index derived from the peer's unique identification number. On a data store, a peer assigned CSSx has the responsibility to calculate and store the x'th CSS for the incoming codeword. The peer needs all of the ISS's of the codeword in order to perform this calculation, and it has these data because they are multicast to all peers in the cluster.

On a data retrieval, if one or more of the peers assigned an ISS for one of the codeword has failed, one of the peers assigned CSSx has the responsibility to regenerate it and transmit it toward the requestor. Another algorithm (or table) designates which CSS is responsible to regenerate each missing ISS. If only one ISS is missing, then the peer responsible to regenerate it needs all of the remaining available ISS's of the codeword in order to do so, and it has these data because the available peers transmitting their ISS's multicast them so they are received by all peers in the cluster. If f ISS's are missing, $1<f\leq F$, then f of the peers assigned CSSx each regenerate a different one of the f different missing ISS's. They also each multicast their CSS's to all peers of the cluster, because each CSS peer needs its own CSS, all the available ISS's, as well as (f−1) of the other CSS's in order to regenerate the designated missing ISS.

As used herein, an "available" peer is a peer that has not failed, or if it has, then it has since recovered. Similarly, and "unavailable" peer is one that has failed and has not yet recovered. A "failed" (unavailable) peer is one that is not able to respond to a particular data retrieval request or store data from a particular data write request, as the case may be. In one embodiment, "peer" failure is considered to occur with a granularity of an entire peer computer system (such as if the computer is down, or otherwise unable to perform with respect to any one or more read or write data). In other embodiments, "peer" failure is considered to occur with finer granularities, such that a peer that is considered to have failed with respect to one segment of data, may not be considered to have failed with respect to a different segment of data. At least for embodiments in which peer failures are considered to occur with a granularity of an entire computer system, each peer computer system in a cluster or cluster group is kept apprised of failures of all relevant peers. For example, each peer may transmit a heartbeat to all other relevant peers on a regular basis, and the non-receipt of a heartbeat signal from a particular peer notifies that peer that the peer that should have transmitted the heartbeat signal has failed. Thus one peer can "determine" whether a second peer is available as easily as the first peer checking its updated table of failed peers. Many other mechanisms will be apparent for keeping all peers apprised of peer failures, to the appropriate level of granularity.

FIG. 3 illustrates the ISS/CSS assignments in the form of a rotational look-up table (RLUT). Whereas some embodiments may actually store a copy of the RLUT accessibly to each of the peers of a cluster, in other embodiments the peers each determine their assignment (and the assignment of all the other peers in the cluster) algorithmically from the codeword number and the peer's own assigned ID number. The algorithm for the construction of the RLUT computes all the vertical codeword patterns in the cycle. Starting with the first peer in the first codeword pattern, it assigns as many codec tasks as there are checksum segments in the codeword. The remaining peers are assigned input symbol storage tasks through the specific designation of an input symbol segment. The rotation continues until all codeword patterns are described. There is a secondary rotation for when there are more CSS's available than failures. The task of repairing the failures rotates among the CSS peers so that some peers are not always repairing while others are idle.

The codeword pattern number corresponding to a particular codeword is determined at the time of storage (encoding). As codewords are stored (encoded) they are implicitly assigned a unique number that reflects their sequential position from the start of the file. The codeword pattern x corresponding to vertical codeword number y in an RLUT of size z is computed using modulus arithmetic as $x=y$ MOD $z$ In the table of FIG. 3, x represents the column number. Given a peer's unique sequence number p within the cluster and codeword pattern x, each peer can easily determine its corresponding action t as $t=$RLUT$(p,x)$ For example, referring to FIG. 3, for a data storage of the $23^{rd}$ codeword of a file, in a cluster having P=7 peers and using FEC F=3, the relevant codeword is x=1 (i.e., CW1 in FIG. 3). For peer p=3, the required action is action t=RLUT (3,1), which is CSS0. Thus peer 3 knows that its responsibility is to calculate and store CSS0 for codeword 23. Overall, it can be seen that the encoding/decoding work is balanced over a complete rotational cycle.

Note that the peers in FIG. 3 are numbered such that the first peer is called peer #0, whereas other descriptions of an identical structure may number the peers such that the first peer is called peer #1. The difference does not affect the overall functions of or relationships among the peers. However, it will be appreciated again that the arrangement of peers in FIG. 2 is logical, not physical. There is no requirement that a lower numbered peer be physically higher in a rack than a higher numbered peer.

A problem occurs when the count of simultaneous peer failures within a single cluster exceeds its FEC level. In a cluster that is configured as 40:36 the maximum FEC is four peers. If a fifth peer in the cluster fails, the entire cluster becomes unusable. The problem can be alleviated by increasing the FEC count to protect against more simultaneous peer failures, but at the expense of a reduced fraction of total disk space available for storing user data. In the cluster group 112, the checksum clusters 220 are used to overcome this problem. The checksum clusters 220 provide "horizontal" resiliency, and can regenerate missing blocks even when one or more whole cluster failures occur.

As described in more detail below, the checksum clusters 220 compute and store checksum blocks computed across all the data clusters 210 in the cluster group 112. More particularly, in each checksum cluster 220, peer #p computes and stores checksums covering all the peers #p of all the group's data clusters 210. For example, peer 0 of checksum cluster k aggregates data block 0 from peer 0 of all of the data clusters 0 through M−1 into a codeword to generate the corresponding checksum block 0. Peer 0 of checksum cluster k also aggregates data block 1 from peer 0 of all of the data clusters 0 through M−1 into a codeword to generate the corresponding checksum block 1, and so on. Peer 1 of checksum cluster k aggregates data block 0 from peer 1 of all of the data clusters 0 through M−1 into a codeword to generate the corresponding checksum block 0. Peer 1 of checksum cluster k also aggregates data block 1 from peer 1 of all of the data clusters 0 through M−1 into a codeword to generate the corresponding checksum block 1, and so on. Thus the protection afforded by RS coding across the clusters is sometimes referred to herein as "inter-cluster" resiliency, data is aggregated across the clusters to develop the RS checksums. Inter-cluster resiliency is also sometimes referred to herein as "horizontal" resiliency, again in keeping with the physical arrangement of a bank of racks, with all the peers having the same peer number p being horizontally aligned with each other. Thus the codewords providing horizontal resiliency are sometimes referred to herein as "horizontal codewords" or "horizontal stripes". Again, though, the use of the term "horizontal" in this context should not be taken to imply that such peers need to be horizontally aligned physically. Note there is no requirement that the horizontal and vertical FEC levels be equal. Note further that the description herein sometimes refers to a particular peer number (e.g. peer #p) in one cluster interacting with a peer of the same number in a second cluster. It will be understood that the reference to the peer of the same number in the second cluster is merely a shorthand way to refer to the peer in the second cluster which is related horizontally to the peer of the same number in the first cluster.

In the embodiment of FIG. 2, each data block is aggregated when it is first written and at every subsequent update. The vertical (intra-cluster) checksum blocks are generated within the cluster, and horizontal (inter-cluster) checksum blocks are generated by every checksum cluster 220 in the cluster group 112, for every data block in the data clusters 210 as they are populated with data. RS coding is used to generate the horizontal checksums, though another embodiment could use a different encoding scheme.

The checksum clusters 220 are able to regenerate data when one or more data clusters 210 incur peer failures that exceed their vertical FEC level, which otherwise would result in the total loss of the data cluster. For example, assuming that the FEC level of a data cluster 220 is exceeded by the failure of its peer 30. The checksum clusters 220 in that cluster group can aggregate the data of all the active peers 30 in remaining data clusters 210 (i.e. a horizontal aggregation) and use their own checksums to regenerate the data of peer 30 in the failed data cluster 210. There are two advantages to this feature. First, even in the event of a catastrophic data cluster failure, as in a total power loss, the cluster group 112 continues to function with no data loss. Second, the data clusters 210 with failure counts that exceed their FEC level remain active as the checksum clusters 220 only regenerate data from the particular peers that have failed. The remaining active peers in the data clusters otherwise failed data cluster continue to participate fully so that they lessen the need for repairs and they do not become stale so that eventual healing of the data cluster will not need to repair their data.

In the embodiment of FIG. 2, there is no rotation of storage/checksum responsibility horizontally as there is vertically within each of the data clusters. Clusters 220 assigned checksum responsibility always have checksum responsibilities. If there is more than one checksum cluster 220, however, a rotation can be implemented among only the checksum clusters to share the workload.

In the embodiment of FIG. 2, all the data and checksum clusters 210 and 220 within the single cluster group 112 have the same peer count P and FEC level F. The usable storage capacity of individual ones of the peers 230 can vary, though preferably it is the same for all the peers in the cluster group 112. If it is not the same, then in an embodiment, storage blocks beyond the number of blocks available in the peer with the least storage capacity, remain unused by the methods described herein. If some peers fill up before others, then when the system attempts to write additional data into them the native filesystem reports an error and those peers are considered as having failed, but only for the files being written. This is considered a run-time error similar to a bad disk block. When the count of such peers exceeds F then no further writes can be made to the file (the cluster is considered full).

The resiliency of the cluster group 112 is mainly directed at preserving user data in the data clusters 210, but because the presence of fully participating checksum clusters 220 enhances such resiliency, it is further beneficial that the checksum clusters 220 themselves be provided with their own resiliency as well. The homogeneity of the peer count and FEC level across all data clusters 210 and checksum clusters 220 within a cluster group 112 results in synchronized codeword rotations. For example codeword rotation CW0 may specify that peers 3, 4, 5 and 6 store user data (ISS) and peers 0, 1 and 2 compute checksum symbols (CSS) for vertical resiliency. Since at codeword rotation 0 all peer 0, 1 and 2 in the data clusters 210 store checksum symbols there is no user data for the peers 0, 1 and 2 of the checksum clusters 220 to encode. No horizontal resiliency is provided for the CSS's in the data clusters 210 in the embodiment of FIG. 2. Instead at codeword rotation 0 the checksum clusters 220 use their peers 0, 1 and 2 to compute checksums for their own vertical resiliency. This added resiliency means that even when in a cluster group the count of peer failures exceeds the FEC of one or more data clusters 210, and the checksum clusters 220 have their own peer failures precluding them from directly performing horizontal repairs, they still can use their own vertical resiliency to repair themselves and then repair the data clusters 210.

In embodiments herein, all the data and checksum clusters within a single cluster group have the same peer count and FEC level. As such, on all data peers block x has the same responsibility (either ISS or CSS) and if block x is an ISS then it is available on all the checksum peers to generate horizontal checksums. If block x on all the data peers is a CSS then block x is available for the checksum peers to generate their own vertical checksums. For the checksum peers, ISS are CSS derived horizontally from user data ISS whereas their CSS blocks are derived vertically from their ISS blocks. This way checksum clusters can heal themselves. For example, considering FIG. 3 and considering only peer 0: blocks on the local stripe files will consist of repetitions of the pattern: block0=CSS, block1=ISS, block2=CSS, block3=ISS, block4=CSS, block5=ISS, block6=ISS. So the block1 ISS collected from all the peer 0 data peers are encoded and are considered an ISS for the peer 0 of the checksum clusters. This applies correspondingly to the four ISS blocks of peer 0 rotation. This leaves the three CSS blocks of the peer 0 rotation available for the checksum clusters to generate their own vertical CSS for self-resiliency so they can heal themselves just like the data clusters. It can be seen that in a horizontal codeword the protected information is all ISS from the data clusters. As all the clusters in a group have the same peer count and FEC it is guaranteed that for a given horizontal stripe of a given block number b across the data clusters all the blocks will be ISS or all the blocks will be CSS. When all the horizontal blocks are ISS the checksum clusters compute a CSS to protect the horizontal data stripe. When all the horizontal blocks are CSS the checksum clusters compute a vertical CSS to protect their vertical stripes. This vertical CSS includes only checksum cluster blocks and no data cluster blocks as these are only CSS and protection of CSS is of low value. Instead the checksum clusters use that "dead" space to protect themselves vertically.

In overall operation, a Hyper Storage Cluster 100 stores data in "files" that match client's view of the files. Each "file" at this level has a file ID that is exposed to client systems 118. To the client, a "file" contains a contiguous set of zero or more data blocks. Inside the HSC, however, a "file" is broken up to span more than one peer, optionally more than one data cluster, and optionally more than one cluster group. The HSC 100 also adds the checksum symbol segments for storage. In one embodiment, the HSC gateway 110 determines which cluster groups are to participate for a given file, and distributes the responsibility as evenly as possible across all the cluster groups. In another embodiment (or in the same embodiment) the client 118 can specify one or more particular cluster groups which are to participate in storing a file.

The HSC gateway 110 breaks up an incoming HSC-level "file" into "data chunks" having a size which is specific to the target cluster group 112. A chunk has the same size as all the ISS's in a vertical stripe in the target cluster group. For example, if a data cluster has P peers and an FEC level of F, then a chunk for that data cluster has P-F data blocks. In one embodiment, the chunk size is constant for all cluster groups. In another embodiment, the chunk size can be different for each cluster group. In the latter embodiment the HSC maintains a table indicating the chunk size for each cluster group.

Within a cluster group, each data chunk is limited to one data cluster. Consecutive "blocks" in a "chunk" are consecutive blocks of an HSC-level "file", but there is no requirement that consecutive "chunks" received by a cluster group for storage belong to the same HSC-level "file". A cluster group gateway determines the data cluster associated with a given chunk and multicasts it to all the peers in that data cluster. As will be seen, the cluster group gateway also multicasts an incoming data chunk to all peers in all checksum clusters in the cluster group as well.

Each data cluster 210 stores data in cluster-specific (vertical) "stripes". Each data stripe is considered herein to span all the peers in a data cluster, even if some of the blocks of the stripe are empty. Each "block" of a vertical stripe is an ISS or CSS. Preferably an ISS has the same length as a "block" at higher levels of the hierarchy, but that is not required in other embodiments. In embodiments in which they are not of the same length, preferably a "block" at higher levels is an integer number of ISS's. Consecutive blocks in a stripe which are ISS's are all segments of a single cluster group-level "chunk".

The data cluster gateway, if there is one, does not actively distribute a vertical "stripe" into peer-specific ISS's. Rather, the ISS's are multicast to all peers in the data cluster and the peers each decide individually, according to the known codeword rotation, which peers store which ISS of the data chunk and which peers generate CSS's.

Peers store data in peer-specific "stripe files", using the filesystem of the peer's underlying operating system. The purpose of a peer-specific "stripe file" is to hold the ISS's and CSS's for which that peer is responsible, from all the "stripes" that the cluster group gateway has assigned to the peer's data cluster for a given filesystem-level file. When a new file is opened at the filesystem level, each peer in all data clusters in all participating cluster groups opens a corresponding stripe file to hold pieces of that file (as well as CSS's generated for that file). Thus each stripe file can contain ISS's from more than one vertical stripe, but not from more than one filesystem-level file. Each "block" of a stripe file is an ISS or CSS. Consecutive blocks in a stripe file are from different vertical stripes.

The physical location of blocks in a stripe file on the peer's local storage medium depends on the peer's local operating system. The peer uses its local operating system to open stripe files and to read from and write to them.

Storage Media in a peer store data according to whatever the native data size is in the medium. For an HDD, for example, the data size may be one sector. For semiconductor storage media, the data size may be one 'page' of memory. Preferably an ISS or CSS has a size that is an integer multiple of the native data size of the storage medium. The peer's operating system determines which data unit(s) of the storage medium to use for each ISS/CSS, and they may bear no relation to the ordering or contiguity of blocks at any higher level. It will be appreciated that the storage medium might even perform yet a further mapping of data units exposed to the operating system, to data units physically on the medium.

Horizontal stripes in a cluster group, as previously mentioned, are stripes of data segments that make up horizontal codewords for providing horizontal resiliency. Horizontal stripes are not organized into "files", nor are they visible at any level above or outside the cluster group. They are used only for horizontal resiliency within the cluster group. The "blocks" in a horizontal stripe are ISS's from stripe files on the peers across data clusters in the cluster group. If each data cluster has P peers, and each peer can hold B ISS/CSS's, then a cluster group has a maximum of P×B horizontal stripes. Since the blocks in a horizontal stripe are stored in files managed by the OS filesystem of various peers, these blocks are 'logical' blocks rather than physical blocks. Horizontal stripes are specific to a single filesystem-level file, just as are the stripe files in a peer.

In order to visualize the distribution of data across an HSC 100, assume the HSC has G cluster groups 112, Mg data clusters 210 in each cluster group g, Pg peers 230 in each data cluster 210 of each cluster group g, and FEC level Fg for each cluster group g. Thus the chunk size in each data cluster in cluster group g has a length of Bg=Pg−Fg data blocks. The vertical stripe size is Pg, since the stripe also includes CSS blocks. For a filesystem-level file to be stored on only a single data cluster, we can dispense with the subscript g in the nomenclature.

Filesystem-level file blocks 0 through B−1 are then stored in the peers in data cluster #0; file blocks B through 2B−1 are stored in the peers in data cluster #1, . . . file blocks B*(M−1) through (B*M)−1 are stored in the peers in data cluster #(M−1); and then the sequence wraps around to data cluster #0. It will be appreciated that in another embodiment, the data clusters may be numbered differently for each filesystem-level file, to thereby spread the data more evenly across the data clusters.

Within each data cluster, data blocks from the file are distributed to the peers in accordance with the RLUT, with F of the peers storing a CSS block rather than a data block from the file (i.e. rather than an ISS). Thus looking at a particular peer's stripe file for this filesystem-level file, one would see a sequence of stripe file blocks that are either ISS's or CSS's, where the ISS's come from widely spaced data block numbers of the filesystem-level file.

For a filesystem-level file to be stored on G>1 cluster groups, the HSC gateway further disperses data chunks among all the data clusters in all G cluster groups. In one embodiment consecutive chunks of the file are distributed to data clusters in different cluster groups, whereas in another embodiment consecutive chunks of the file are distributed among all the data clusters in one cluster group before chunks are distributed to data clusters in the next cluster group. It will be appreciated that in some embodiments, consecutive chunks of a different filesystem-level files are or can be distributed in different sequences among the cluster groups and/or data clusters.

Multicast Burst Protocol

Embodiments of the system of FIG. 1 use a Multicast Burst Protocol (MBP) to transmit data among the peers in a cluster group (and, in some embodiments, among all the peers in the entire HSC 100). The MBP is described in detail in the above-incorporated '575 patent application, and that description is incorporated herein by reference. Of particular note herein is that the MBP incorporates a "multicast group subscription" feature similar to the conventional IP Multicast standard in order to direct the transmission of data to selected recipient peers. In a cluster group structure such as that of FIG. 2, all the peers in a first one of the data clusters 210 subscribe to the same multicast group. When a gateway is said to transmit a chunk of data "to all the peers in the data cluster", it accomplishes this by transmitting it to the multicast group to which all the peers in the first data cluster are subscribed. Similarly, all the peers in a second one of the data clusters 210 in the cluster group subscribe to a different multicast group. The peers in the second data cluster do not receive the data chunks that are transmitted "to all the peers in the first data cluster". In an embodiment, if the peers in the second data cluster share a LAN segment with the peers in the first data cluster, then data chunks sent "to" the peers in the first data cluster will reach the peers in the second data cluster in an electronic sense. However, they will be ignored by the peers in the second data cluster since the destination IP address in such data packets do not match any multicast group IP address to which these peers are subscribed. As used herein, peers which ignore data packets because of a non-matching destination IP address are said not to "receive" such data packets, and the packets are not considered to have been transmitted "to" or "toward" such peers. In any event, the arrangement preferably includes managed switches through which data packets are transmitted within the HSC 100. The managed switches are configured to prevent multicast messages from reaching unsubscribed peers even in an electronic sense. As used herein, a transmission of data "toward" a particular destination involves only that the sending unit transmit the data as appropriate to reach the destination. The transmission is not required to reach the destination in order for a transmission "toward" the destination to have been accomplished. All the peers in all the checksum clusters 220 in the cluster group subscribe to the multicast groups for all of the data clusters in the cluster group. Thus any data chunk sent from a gateway to the peers in any of the data clusters in the cluster group will also be received by all the peers in all the checksum clusters 220 in the cluster group.

The same multicast group subscriptions are also used by the peers when they transmit data blocks vertically or horizontally, for example for checksum purposes, or as part of a data retrieval operation. Thus when a particular peer transmits an ISS vertically within its data cluster, it transmits the data to the multicast group for that data cluster. This automatically accomplishes a transmission of the data horizontally to corresponding peers in the checksum clusters, because they also subscribe to the same multicast group. In this case other peers dispersed vertically within the checksum clusters that may not need the data "receive" it anyway; they may ignore the data because they are not involved in storage of or resiliency with respect to such data. But they do subscribe to a matching destination IP address, so they are still considered herein to "receive" the data, and the data is still considered to have been transmitted "to" or "toward" such peers. It will be understood that as used herein, if data is said herein to be transmitted "to" or "toward" a particular peer or set of peers, that does not preclude that it may also be transmitted "to" or "toward" other peers as well.

It can be seen that the abstraction of a "data cluster" is defined by the multicast group number to which its peers subscribe, rather than by any physical location of the peer computers. Similarly, in some embodiments, a "cluster group" can be defined in the same way: by the set of multicast groups to which its internal peers subscribe.

File Opening

Figure 4:
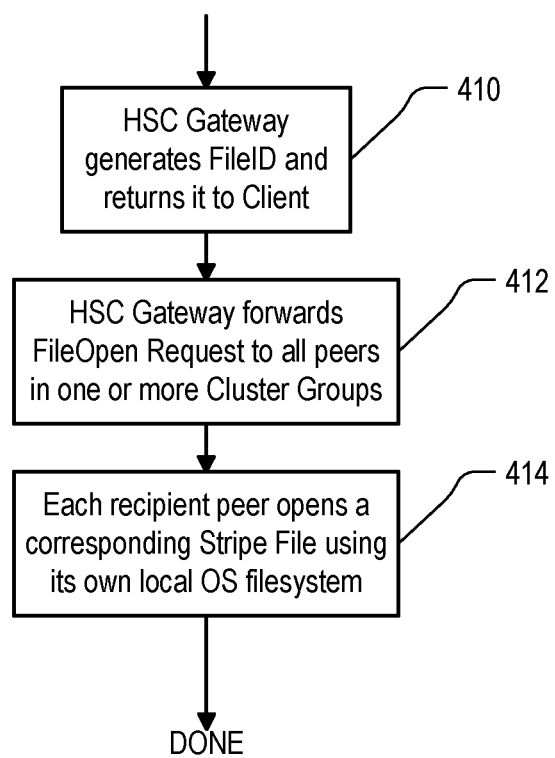
FIG. 4 is a flowchart illustrating basic operation of the HSC of FIG. 1 upon receipt of a FileOpen command.

FIG. 4 is a flowchart illustrating the basic operation of HSC 100 upon receipt of a FileOpen command from a client 118. As used herein, the terms "command", "request", and "inquiry" are used interchangeably. As with all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

Referring to FIG. 4, upon receipt of a FileOpen command, in step 410 the HSC gateway 110 generates a file ID and returns it to the Client 118. (In some embodiments an intermediary such as a kernel receives the file ID and returns a different handle to the Client 118.) In step 412, the HSC gateway forwards the command to all peers in one or more of the cluster groups 112 in the HSC 100. In one embodiment, the originating client 118 specifies the cluster group or cluster groups on which to open the file, or it can specify that the file be open on all cluster groups in the HSC 100. In another embodiment, the HSC gateway 110 controls which of the cluster groups on which to open the file. In step 414, each recipient peer 230 opens a corresponding local Stripe File using its own local OS filesystem. Thus each peer participating in the storage of the identified filesystem-level file has a corresponding Stripe file. This stripe file will store only those ISS's and CSS's that are assigned to that peer in accordance with the RLUT. In a different embodiment, each peer need not open stripe files; rather it merely treats its storage as a 'sea of blocks'. The use of stripe files corresponding to filesystem-level files is preferred, however, because among other things, it could make healing a failed peer or data cluster much less time consuming. If the peer's data is stored in a sea of blocks, then it may not be known which blocks were in use at the time of the failure. Therefore all blocks in the peer's storage device would have to be regenerated. On the other hand, if the peer's data is stored in files, then only the blocks that are in files need be regenerated.

Data Write Command

Figure 5:
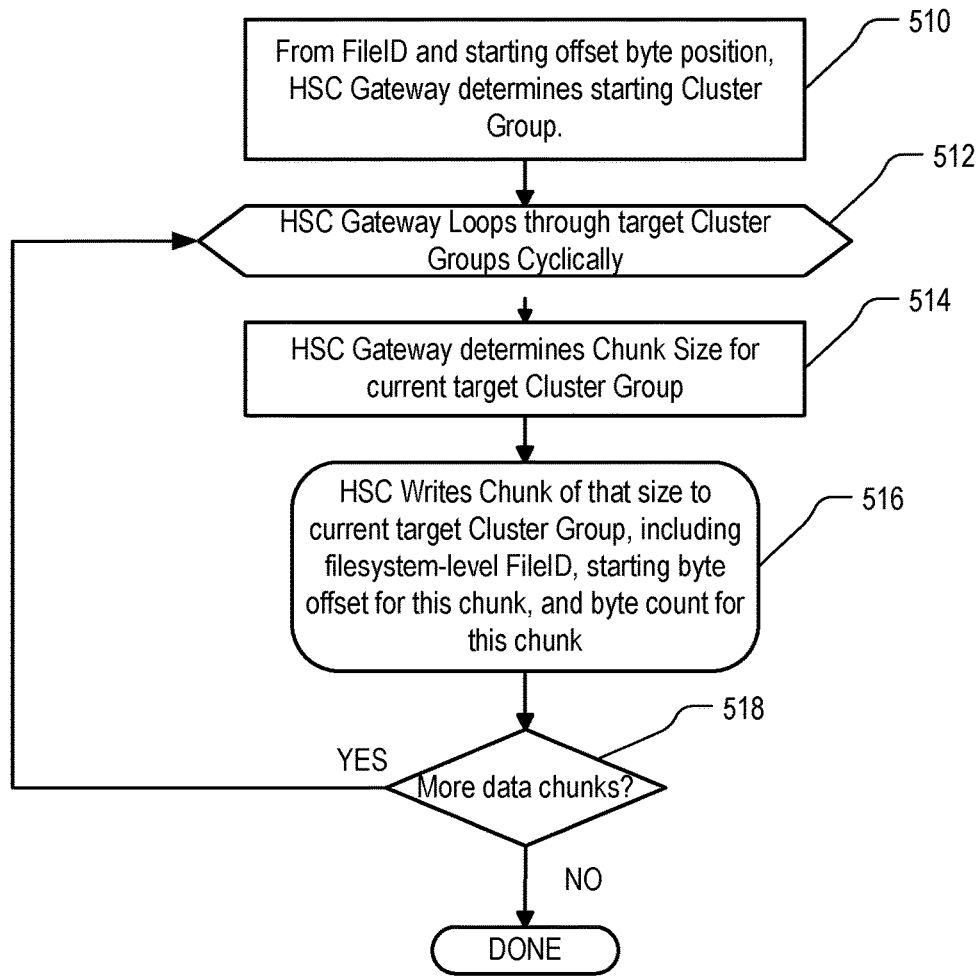
FIG. 5 is a flowchart illustrating basic operation of the HSC of FIG. 1 upon receipt of a data write command.

FIG. 5 is a flowchart illustrating the basic operation of HSC 100 upon receipt of a data write command from a client 118. In such a command the HSC 100 receives a data set to write, in association with the identity of filesystem-level file ID, starting offset byte position within the file, and byte count to write. As used herein, a data "set" is a set of one or more bytes, to be written to or read from the cluster group. The data set need not begin at the beginning of a stripe, nor even at the beginning of a data block. Nor must it end at a stripe or data block boundary.

In step 510, the HSC gateway 110 determines from file ID and starting offset byte position, the starting cluster group 112 to which the first byte of the data set is to be written. The HSC gateway 110 maintains a table of filesystem-level File ID's to starting cluster group number, and uses a repeatable rotation algorithm to calculate the starting cluster group for the data write.

The HSC gateway 110 divides the incoming data set into data chunks, which it distributes cyclically among the cluster groups 110 according to the rotation algorithm. Thus in step 512, the HSC gateway 110 begins a loop through target cluster groups 112 cyclically according to the rotation algorithm. Note that in an embodiment, the particular sequence of cluster groups in the cycle can be different for different filesystem-level files.

A data chunk has the same size as all the ISS's in a vertical stripe in the target cluster group. In one embodiment, the chunk size is constant for all cluster groups. In another embodiment, the chunk size can be different for each cluster group. In the latter embodiment the HSC gateway 110 maintains a table indicating the chunk size for each cluster group. Thus in step 514, the HSC gateway 110 determines the chunk Size for the current target cluster group 112.

In step 516, the HSC gateway 110 writes a chunk of the appropriate size to the current target cluster group. The write command includes the filesystem-level file ID, the starting byte offset for this chunk within the file, and the byte count for this chunk. In the embodiment of FIG. 5, if the starting byte offset of the incoming data set is not on a stripe boundary, then the first chunk will be short. Similarly, if data set does not end on a codeword boundary, then last chunk will be short. It is possible that a very short incoming data set will neither begin nor end on a codeword boundary.

In this embodiment, the HSC gateway 110 need only be concerned with which cluster group is to receive each data chunk. As will be seen, a gateway in each cluster group is responsible for further distributing incoming data chunks among the data clusters in that cluster group. In another embodiment, the cluster groups do not have their own gateways (at least for this purpose), and the HSC gateway 110 takes on this responsibility as well. In the latter embodiment, the HSC gateway 110 sends each chunk directly to all the peers in the appropriate data cluster within each target cluster group.

In step 518 the HSC gateway 110 determines whether the incoming data set contains more chunks to transmit, and if so, returns to step 512 to transmit the next chunk toward the next target cluster group 112.

Figure 6:
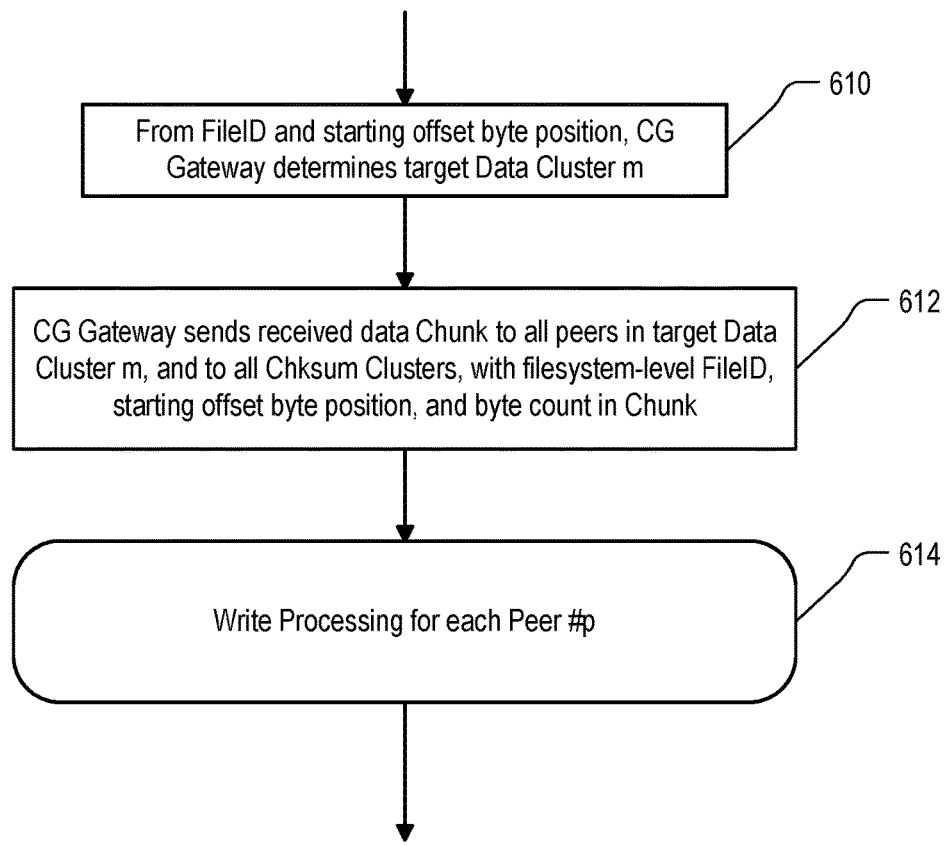
FIG. 6 is a flowchart illustrating basic operation of the HSC of FIG. 1 upon receipt of a data chunk to write.

FIG. 6 is a flowchart illustrating the basic operation of a representative one of the cluster group gateways 240, upon receipt of a data chunk to write. A cluster group may have more than one gateway, thereby minimizing bottlenecks; the operation of a representative one of such gateways is described in FIG. 6.

The arriving data chunk comes associated with the identity of the filesystem-level file ID for the data set, the starting offset byte position of the chunk, and a byte count. In step 610, the cluster group gateway 240 determines target data cluster m from the file ID and starting offset byte position of the arriving data chunk within the filesystem-level file. The cluster group gateway 240 maintains a table with this information for each filesystem-level file.

The byte offset that accompanies a write command (or a read command) from the client is a byte offset within the filesystem-level file. But the individual cluster groups are not required to be aware of each other, and therefore do not know how large the rotation is by which the filesystem-level file is distributed among cluster groups. Thus for forwarding the read or write to a cluster group, the HSC gateway converts the byte offset to one that would be meaningful for the cluster group. Thus the byte offset accompanying a read or write command to a cluster group indicates the data chunk's byte offset within only those portions of the filesystem-level file that the particular cluster group is designated to store. This version of the byte offset is sometimes referred to herein as a "cluster-group-centric" byte offset.

Similarly, the individual data clusters in a cluster group also are not required to be aware of each other, and therefore do not know how large is the number of data clusters across which the cluster group is distributing the portions of the filesystem-level file that the cluster group is responsible to store. Thus for forwarding the read or write to the peers in a data cluster, the cluster group gateway further converts the incoming specified byte offset to one that would be meaningful for the peers in the data cluster. Thus the byte offset accompanying a read or write command to the peers in a data cluster indicates the data chunk's byte offset within only those portions of the filesystem-level file that the particular data cluster is designated to store. This version of the byte offset is sometimes referred to herein as a "data-cluster-centric" or "peer-centric" byte offset.

As mentioned, data chunks in a data cluster are stored in vertical stripes, so conceptually the byte offset as received by a data cluster can be thought of as being further divisible into a vertical stripe number and a byte offset within that vertical stripe number. However, the data clusters do not maintain vertical stripes as a separate construct. Instead, each peer p of the data cluster has its own stripe file corresponding to the filesystem-level file, and these stripe files contain only one block of each vertical stripe. Each peer thus determines from its own number p and the byte offset indicated to the peers in the data cluster, which block b of the peer's stripe file for the particular filesystem-level file is relevant to the read or write request.

In step 612, the cluster group gateway 240 sends the received data chunk to all peers in target data cluster m, as well as to all checksum clusters 220, with an identification of the filesystem-level file, the data-cluster-centric starting offset byte position, and the byte count in the chunk. This transmission is accomplished by multicast, so all peers in the target data cluster, as well as all the peers in all the checksum clusters 220 in the cluster group, receive all of the data blocks in the incoming chunk. In step 614, all of the peers perform write processing in parallel.

Figure 7:
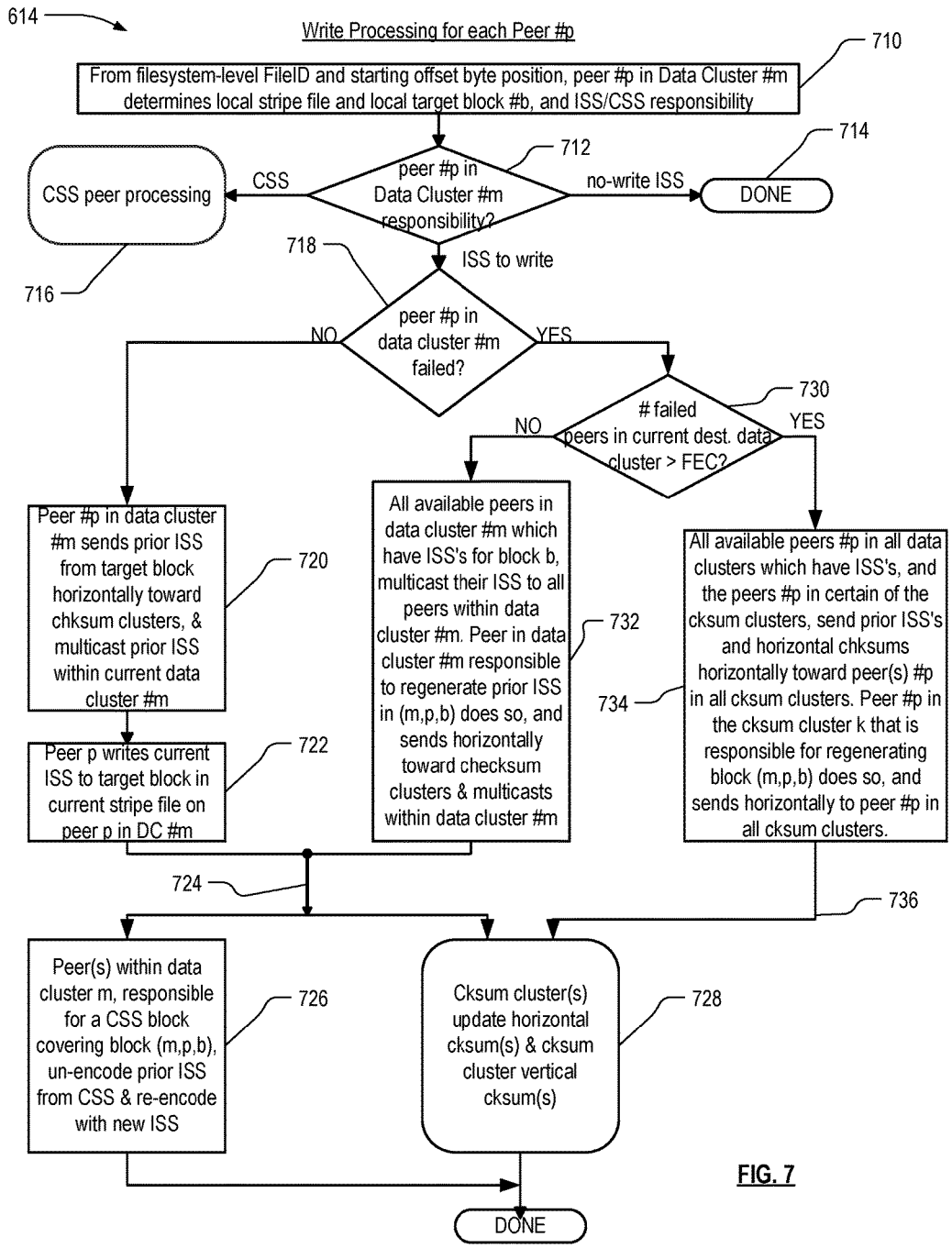
FIG. 7 is a flowchart illustrating basic operation of a particular peer in a data cluster upon receipt of a data chunk to write.

FIG. 7 is a flowchart illustrating the basic operation of a particular peer #p in a data cluster 210, upon receipt of a data chunk to write. The flow chart should be seen as a logic flow which determines which active steps 714, 716, 720/722, 732 or 734 are performed by various peers. The decision steps 712, 718 and 730 describe the logic in a flow form, but the tests described in each decision step can be performed in any order, or partially or entirely simultaneously. Importantly, the determination of which active step to perform is made individually by each relevant peer, rather than by a centralized gateway or other centralized controller. If peer #p is available, for example, then peer #p (in addition to other relevant peers) make the determinations of the logic flow. If a particular peer has failed, that peer does not make these determinations (except in some circumstances in which the failure is not complete). But the determinations as made by other relevant peers will nevertheless lead to the appropriate active step 732 or 734 (discussed below), which describe what other peers do, even though the failed peer is not able to make the same determinations. The other peers are aware of their responsibilities in steps 732 and 734 because of the common RLUT, the multicasting of requests, write data and retrieved or regenerated data to all relevant peers, and knowledge by each peer of which other peer(s) have failed.

In step 710, it is determined from the file and the data-cluster-centric starting byte offset of the incoming chunk, plus the peer number p, which codeword of the RLUT applies to the chunk and which (if any) target block #b of peer #p's local stripe file for the current filesystem-level file is to be modified in response to the write command. It is also determined from the RLUT and the relevant codeword what peer #p's responsibility is with respect to the incoming data chunk: store a data block of the chunk as an ISS in block #b of the peer's stripe file (and store which data block of the chunk); update a CSS in block #b of the peer's stripe file; or nothing. If peer #p is available, then peer #p (in addition to other relevant peers) makes the above determinations. The peer's responsibility can be nothing if, for example, the relevant codeword calls for the peer to write a data block of the chunk, but the starting byte position begins after the end of the data block designated by the codeword. The peer's responsibility can be nothing also if the relevant codeword calls for the peer to write a data block of the chunk, but the byte count indicates that the data chunk ends before the beginning of the data block designated by the codeword. Additionally, if the starting byte offset for the incoming data chunk is within an ISS which the peer is responsible to store in block #b, the peer also calculates the starting offset within the ISS. And if the count of bytes to write is such that the end of the incoming data chunk is within an ISS which the peer is responsible to store in block #b, the peer also calculates the count of bytes to store within the ISS. It will be appreciated that both of these situations may be true, since the HSC 100 can be used to store very short data sets, including a data set that is as short as a single byte.

In step 712, it is determined what the responsibility is for peer #p. If its responsibility is to store an ISS which does not exist in the data chunk, then in step 714 the peer's write processing for the data chunk is ended. If its responsibility is to update a CSS, then if peer #p is available, it performs CSS peer processing steps 716. Step 716 is described below with respect to FIG. 9. If peer #p's responsibility is to store an ISS, then the cluster group's job is not only to store the incoming ISS in the peer's target stripe file block #b (if peer #p is alive), but also to provide the previous ISS to all the peers that will be updating checksums, both vertically and horizontally. The remaining steps in FIG. 7 illustrate how this can be accomplished where none, one, or more than one of the peers that must participate in the transaction, have failed.

In step 718, if the peer #p is available (not failed), then in step 720, the peer #p transmits the prior contents of the target block #b horizontally toward the checksum clusters 220, and also sends it to all peers within the peer's own data cluster #m. These transmissions all can be accomplished by a single multicast transmission of the data using the MBP. As mentioned, since all of the peers in the checksum clusters 220 subscribe to all the multicast groups for all the data clusters, all the peers in the checksum clusters 220 will receive these data as well; that does not change the fact that the data are being sent to the horizontally related peers in the checksum clusters 220. Note that for writes in which less than a full ISS is to be updated in block #b, only the affected bytes are transmitted vertically and horizontally since only the corresponding bytes of the relevant checksum blocks will be updated. In step 722, peer #p writes current ISS to its target block #b in the peer's stripe file.

At this point 724, all of the peers, both vertically and horizontally related to peer #p, which are responsible for generating or updating a CSS covering block #b of peer #p in data cluster #m, have been sent both the prior ISS from block #b and the new ISS for block #b. They therefore have the data they need to de-encode the prior ISS from their stored CSS, and re-encode it with the new ISS data. Thus in step 726 the peer(s) within data cluster m that are responsible for a CSS block covering block (m,p,b), un-encode prior ISS from their pre-existing CSS, and re-encode it with the new ISS. In parallel, in step 728, each peer #p of each of the checksum clusters 220 updates its horizontal checksum covering block (m,p,b). The affected checksum clusters also update their own vertical checksum blocks. More detail on step 728 is provided below with respect to FIG. 8.

Returning to step 718, if peer #p in data cluster #m has failed, but the number of failed peers in data cluster #m is still less than or equal to the FEC of the cluster (step 730), then in step 732, all "available" peers in data cluster #m which have an ISS in block #b of their respective stripe files multicast their stored ISS's to all peers within data cluster #m. Some number f≤FEC of the peers in data cluster #m which have CSS blocks covering block #b of peer #p also multicast their CSS's to all peers within data cluster #m, where f is the number of failed peers in data cluster #m. The peer in data cluster #m that is responsible (according to a repair rotation RLUT) to regenerate the prior ISS in (m,p,b) does so, and sends it both horizontally toward the checksum clusters 220 and also multicasts it within data cluster #m. The repair rotation RLUT is different from the dispersal RLUT (e.g. FIG. 3), and is computed each time a peer fails. Now, at this point 724, again all of the peers, both vertically and horizontally related to peer #p, which are responsible for generating or updating a CSS covering block #b of peer #p in data cluster #m, have been sent both the prior ISS from block #b and the new ISS for block #b. They therefore have the data they need to de-encode the prior ISS from their stored CSS, and re-encode it with the new ISS data. Steps 726 and 728 can then take place as above.

Again returning to step 718, if peer #p in data cluster #m has failed, and the number of failed peers in data cluster #m is greater than the FEC of the cluster (step 730), then the data cluster #m is considered herein to have "failed". But because of horizontal resiliency, the HSC 100 still can be updated in a manner by which the newly arrived ISS can later be retrieved. In particular, in step 734, all available peers #p in all data clusters 210 which have ISS's. send their prior ISS's and horizontal checksum blocks horizontally toward peer(s) #p in all the checksum clusters 220. In addition, certain ones of the available peers #p in of the checksum clusters 220 also send their prior ISS's and horizontal checksum blocks horizontally toward peer(s) #p in all the checksum clusters 220. Peer #p in the checksum cluster k that is responsible for regenerating block (m,p,b) does so, and sends it horizontally to peer #p in all the checksum clusters 220. Again, at point 736, the horizontally related checksum cluster peers now have both the prior ISS and the current ISS for use in un-encoding and re-encoding their horizontal checksum blocks. Step 728 proceeds as above. In an embodiment, the checksum clusters 220 implement a mini-rotation to determine both the checksum cluster k that is responsible for regenerating block (m,p,b) and which peer(s) #p of the checksum clusters 220 are responsible to send their horizontal checksum blocks. In general fh−1 checksum cluster peers #p send their horizontal checksum blocks, where fh is the number of data peers that have failed in the horizontal stripe for peers #p.

In another embodiment, if one of the peers #p which is responsible for transmitting a prior ISS's or horizontal checksum block toward the checksum clusters 220 is itself unavailable, but the cluster having that peer does not itself have more than F peer failures, then that cluster regenerates the missing prior ISS or horizontal checksum block vertically and transmits it toward checksum clusters 220.

Thus it can be seen that a cluster group 112 according to aspects of the invention can provide resiliency in stored data even where the peer which contained the data has failed, and even where that peer's own data cluster has had too many failures to permit regeneration of the data by that data cluster alone. It is also noteworthy that data storage to a peer 230 which is alive, in a data cluster 210, can still store the incoming data even if other peer failures in that data cluster mean that the data cluster has "failed" (more failures than the FEC level). In this case steps 718, 720, 722, and 728 are performed. Thus that newly stored data is still protected by horizontal (if not vertical) redundancy.

Figure 8:
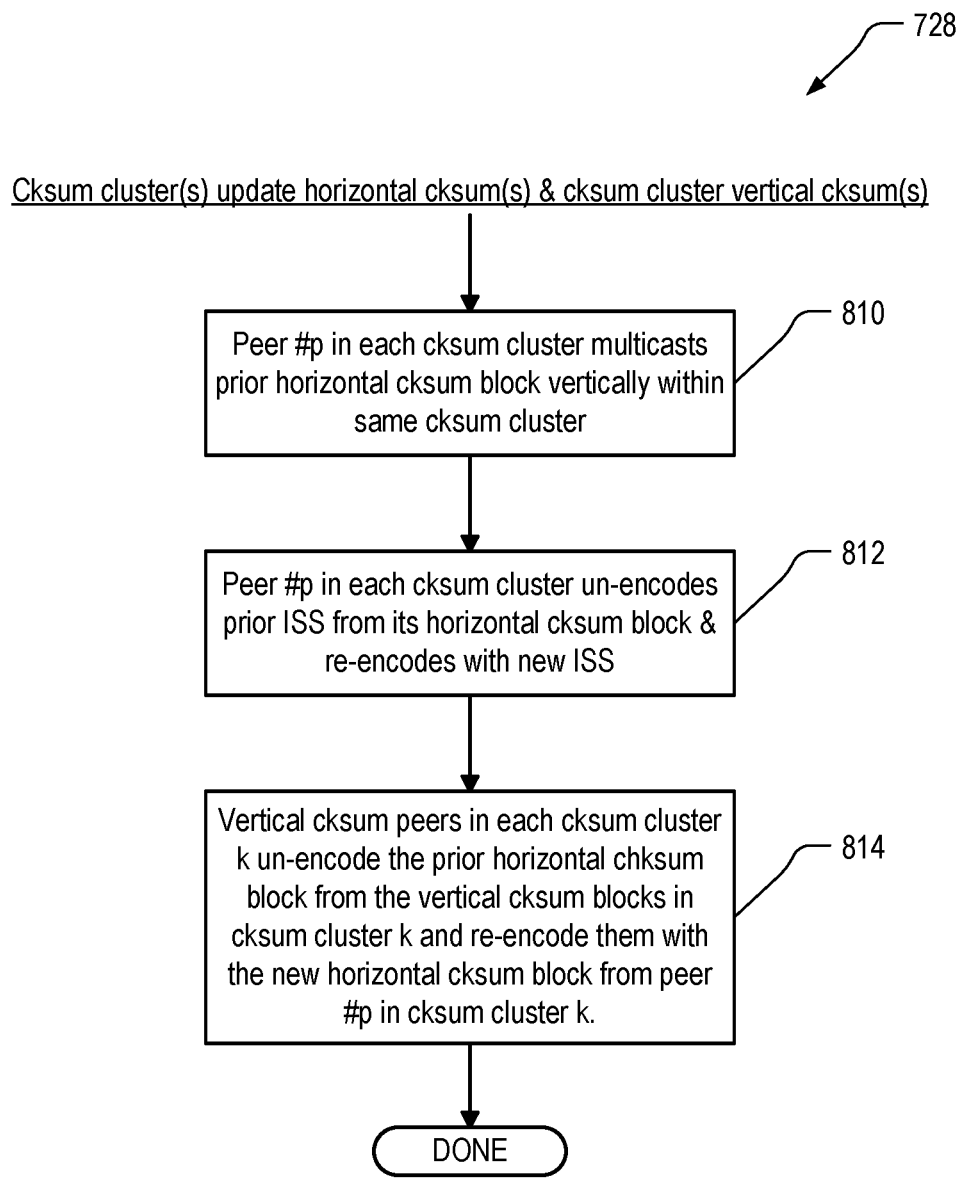
FIG. 8 is a flow chart detail of step 728 of FIG. 7.

FIG. 8 is a flow chart detail of step 728 (FIG. 7). As shown, in step 810, peer #p in each checksum cluster 220 multicasts its prior horizontal checksum block vertically within same checksum cluster 220. In step 812, peer #p in each checksum cluster 220 un-encodes the prior ISS from its horizontal checksum block and re-encodes it with the newly arrived ISS. And in step 814, each of the vertical checksum peers in each checksum cluster k un-encodes the prior peer #p horizontal checksum block from the vertical checksum block in checksum cluster k and re-encodes it with the new peer #p horizontal checksum block in checksum cluster k.

Figure 9:
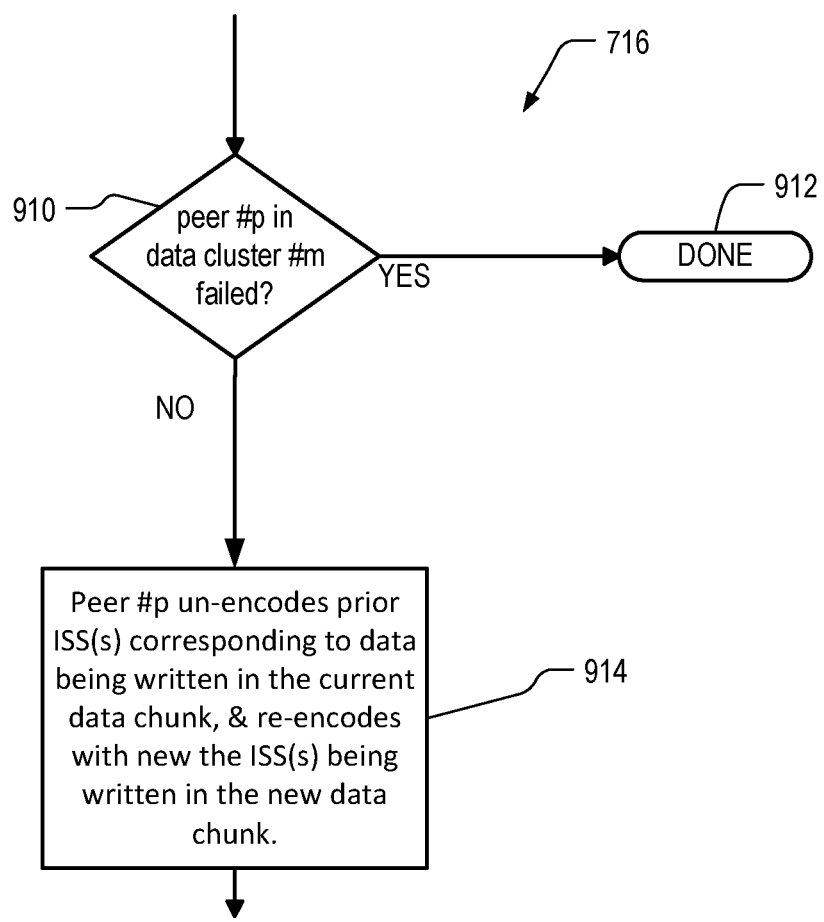
FIG. 9 is a flow chart detail of step 716 of FIG. 7.

FIG. 9 is a flowchart detail of step 716 (FIG. 7) for CSS peer processing in the event the responsibility of peer #p for the peer's target stripe file block #b is to generate and store a CSS block covering the incoming data chunk. Initially, if peer #p has failed (step 910), then clearly it does not generate a CSS (step 912). Assuming peer #p is alive, however, then from step 726 it has or will receive each new ISS to be stored in the peers of data cluster #m, as well as the prior ISS data from the same blocks where the new ISS data will be written. Thus in step 912 peer #p un-encodes all the prior ISS data from the prior CSS in block #b of the stripe file in peer #p, and re-encodes the CSS with all of the new data blocks being written from the incoming data chunk. Note that no transmission of either the prior or newly calculated CSS takes place horizontally, since in the embodiment of FIG. 2, CSS's are not protected by horizontal resiliency.

Note that the process of de-encoding and re-encoding CSS's can be time consuming, and also unnecessary where the data footprint covers a codeword entirely. In that situation, in an embodiment, the system does not require old values to de-encode and re-encode. Instead the system simply encodes the entire codeword anew. Note that this is always the case when appending to a file (e.g. writing beyond EOF) as there are no old values. If the data footprint covers less than one codeword (referred to herein as a partial codeword write), then the system can either get the complementary old values (and re-encode the entire codeword), or it can get the overwritten old values and de-encode/re-encode the partial codeword. In an embodiment, the cluster picks whichever method requires the least network I/O.

Data Read Command

Figure 10:
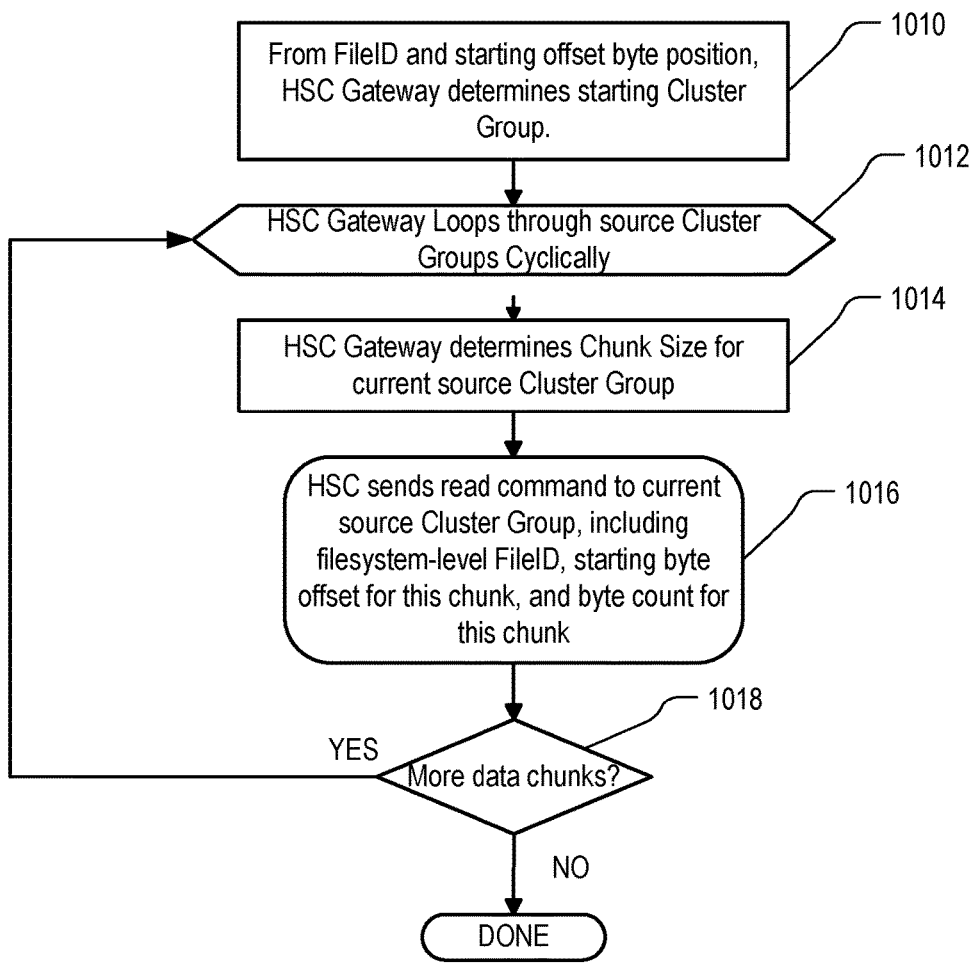
FIG. 10 is a flowchart illustrating basic operation of HSC 100 upon receipt of a data read command.

FIG. 10 is a flowchart illustrating the basic operation of HSC 100 upon receipt of a data read command from a client 118. In such a command the HSC 100 receives the read command, in association with the identity of filesystem-level file ID, starting offset byte position within the file, and byte count to read. As with data writes, the specified read data set need not begin at the beginning of a stripe, nor even at the beginning of a data block. Nor must it end at a stripe or data block boundary.

In step 1010, the HSC gateway 110 determines from file ID and starting offset byte position, the starting cluster group 112 from which the first byte of the data set is to be read.

The HSC gateway 110 divides the requested data set into data chunks, and will forward individual read requests for such chunks to the cluster groups 110 according to the rotation algorithm. The chunks are each of appropriate size for the respective cluster group 112. Thus in step 1012, the HSC gateway 110 begins a loop through source cluster groups 112 cyclically according to the rotation algorithm. Note that in an embodiment, the particular sequence of cluster groups in the cycle can be different for different filesystem-level files.

In step 1016, the HSC gateway 110 sends a read request for a chunk of the appropriate size to the current source cluster group. The read command includes the filesystem-level file ID, the starting byte offset for this chunk within the stripe file, and the byte count for this chunk. As for a data write, if the starting byte offset of the requested data set is not on a stripe boundary, then the first chunk will be short. Similarly, if data set does not end on a codeword boundary, then last chunk will be short. Both may be the case for some read requests.

In this embodiment, the HSC gateway 110 need only be concerned with which cluster group is to receive each data chunk. As will be seen, a gateway in each cluster group is responsible for further forwarding incoming data chunk read requests to the appropriate data clusters in that cluster group. In another embodiment, the cluster groups do not have their own gateways (at least for this purpose), and the HSC gateway 110 takes on this responsibility as well. In the latter embodiment, the HSC gateway 110 sends each chunk read request directly to all the peers in the appropriate data cluster within each source cluster group.

In step 1018 the HSC gateway 110 determines whether the requested data set contains more chunks to retrieve, and if so, returns to step 1012 to request the next chunk from the next source cluster group 112.

Figure 11:
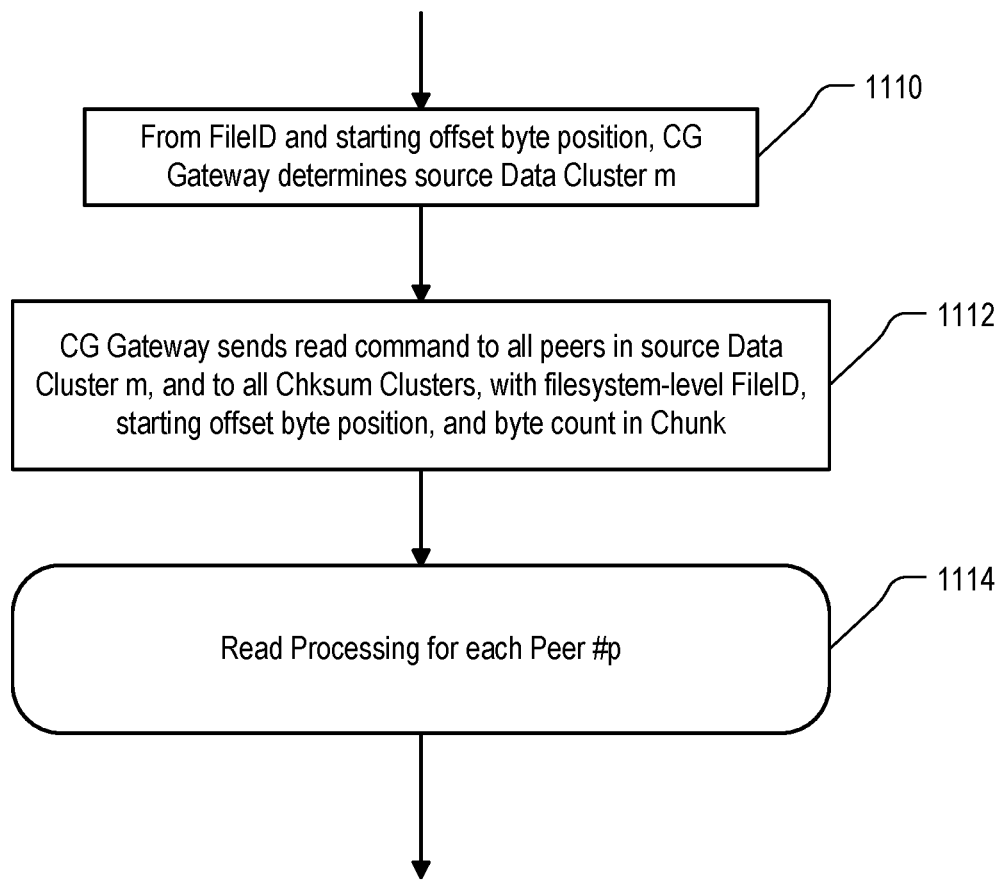
FIG. 11 is a flowchart illustrating basic operation of a cluster group gateway upon receipt of a data chunk read request.

FIG. 11 is a flowchart illustrating the basic operation of a cluster group gateway 240, upon receipt of a data chunk read request. The arriving data chunk read request comes associated with the identity of the filesystem-level file ID for the data set, the cluster group-centric starting offset byte position of the chunk within the file, and a byte count. In step 1110, the cluster group gateway 240 determines source data cluster m from the filesystem-level file ID and data cluster-centric starting offset byte position of the arriving data chunk within the data clusters vertical stripes for the indicated filesystem-level file.

In step 1112, the cluster group gateway 240 sends the data chunk read request to all peers in source data cluster m, as well as to all checksum clusters 220, with an identification of the filesystem-level file, the starting offset byte position within the peer's stripe files, and the byte count of the chunk. This transmission is accomplished by multicast, so all peers in the source data cluster, as well as all the peers in all the checksum clusters 220 in the cluster group, receive the data chunk read request. In step 1114, all of the peers perform read processing in parallel.

Figure 12:
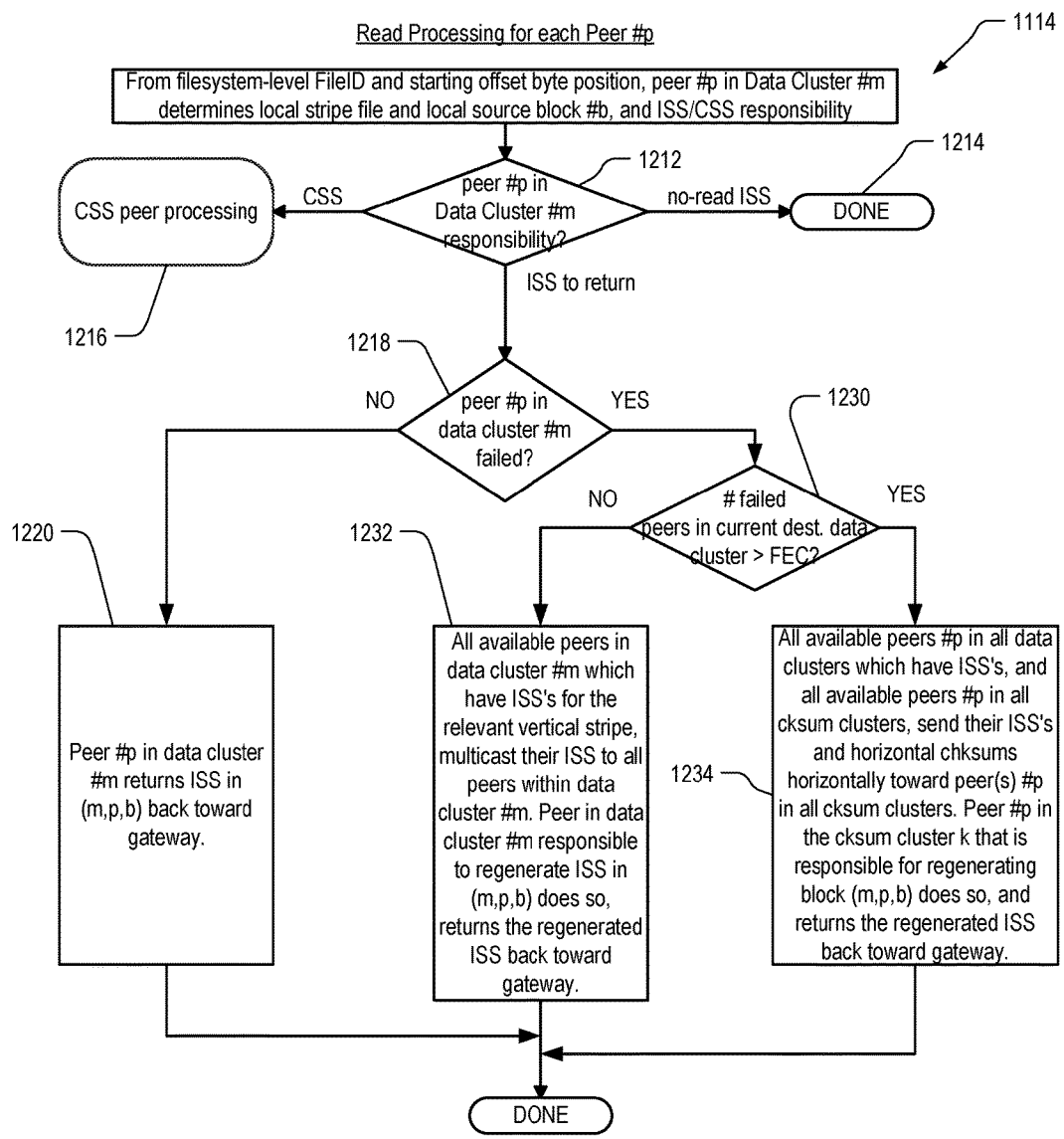
FIG. 12 is a flowchart illustrating basic operation of a particular peer in a data cluster upon receipt of a request to read a data chunk.

FIG. 12 is a flowchart illustrating the basic operation of a particular peer #p in a data cluster 210, upon receipt of a request to read a data chunk. As with the flow chart of FIG. 7, the flow chart should be seen as a logic flow which determines which active steps 1214, 1216, 1220, 1232 or 1234 are performed by various peers. The decision steps 1212, 1218 and 1230 describe the logic in a flow form, but the tests described in each decision step can be performed in any order, or partially or entirely simultaneously. Importantly, the determination of which active step to perform is made individually by each relevant peer, rather than by a centralized gateway or other centralized controller. If peer #p is available, for example, then peer #p (in addition to other relevant peers) make the determinations of the logic flow. If a particular peer has failed, that peer does not make these determinations (except in some circumstances in which the failure is not complete). But the determinations as made by other relevant peers will nevertheless lead to the appropriate active step 1232 or 1234 (discussed below), which describe what other peers do, even though the failed peer is not able to make the same determinations. The other peers are aware of their responsibilities in steps 1232 and 1234 because of the common RLUT, the multicasting of requests, write data and retrieved or regenerated data to all relevant peers, and knowledge by each peer of which other peer(s) have failed.

In step 1210, it is determined from the file and the starting byte offset of the requested chunk, plus the peer number p, which codeword of the RLUT applies to the chunk and which (if any) source block #b of peer #p's local stripe file for the current filesystem-level file is to be read in response to the read command. It is also determined from the RLUT and the relevant codeword what peer #p's responsibility is with respect to the requested data chunk: return a data block of the chunk as an ISS in block #b of the peer's stripe file (and return which data block of the chunk); potentially transmit a CSS in block #b of the peer's stripe file; or nothing. If peer #p is available, then peer #p (in addition to other relevant peers) makes the above determinations.

In step 1212, it is determined what the responsibility is of peer #p. If the peer's block #b has an ISS which is not requested by the read request, then in step 1214 the peer's read processing for the data chunk is ended. If the block has a CSS, then if peer #p is available, the peer performs CSS peer processing steps 1216, either to regenerate a missing ISS or to transmit its CSS to enable another peer to do so.

In step 1218, if the peer #p is available (not failed), then in step 1220, the peer #p transmits the contents of block #b of its stripe file as an ISS back toward the cluster gateway. It also sends it to all peers within the peer's own data cluster #m, and to all the peers in all the checksum clusters 220 in the cluster group. Note that for reads in which less than a full ISS is to be returned from block #b, only the affected bytes are transmitted vertically and horizontally.

Returning to step 1218, if peer #p in data cluster #m has failed, but the number of failed peers in data cluster #m is still less than or equal to the FEC of the cluster (step 1230), then in step 1232, all "available" peers in data cluster #m which have an ISS in block #b of their respective stripe files multicast their stored ISS's to all peers within data cluster #m. Some number f≤FEC of the peers in data cluster #m which have CSS blocks covering block #b of peer #p also multicast their CSS's to all peers within data cluster #m, where f is the number of failed peers in data cluster #m. The peer in data cluster #m that is responsible to regenerate the missing ISS does so, and returns it toward the gateway.

Again returning to step 1218, if peer #p in data cluster #m has failed, and the number of failed peers in data cluster #m is greater than the FEC of the cluster (step 1230), then the data cluster #m is considered herein to have "failed". But because of horizontal resiliency, the HSC 100 still often can return the requested ISS. In particular, in step 1234, all available peers #p in all data clusters 210 which have ISS's, and all available peers #p in all of the checksum clusters 220, send their ISS's and horizontal checksum blocks horizontally toward peer(s) #p in all the checksum clusters 220. Peer #p in the checksum cluster k that is responsible for regenerating the requested ISS does so, and returns it to the cluster group gateway. If peer #p in any of the needed checksum clusters themselves have failed, then its missing CSS is regenerated vertically within the checksum cluster.

In another embodiment (not shown), if one of the peers #p which is responsible for transmitting an ISS's or a horizontal checksum block toward the checksum clusters 220 is itself unavailable, but the cluster having that peer does not itself have more than F peer failures, then that cluster regenerates the missing ISS or horizontal checksum block vertically and transmits it toward checksum clusters 220.

Thus it can be seen again that a cluster group 112 according to aspects of the invention can provide resiliency in stored data even where the peer which contained the data has failed, and even where that peer's own data cluster has had too many failures to permit regeneration of the data by that data cluster alone.

Healing

Healing of data clusters proceeds on a per-data cluster basis, as described in the above-incorporated '575 patent application when the count of failed peers being healed is no greater than the FEC level. Healing a cluster involves reading every block of every stale file. Thus the healing process, which in an embodiment can be done even while the data cluster is online and even while clients are reading and writing to it, involves first bringing a previously erased peer or data cluster back online, then performing a nested loop of cycling through all the filesystem-level files stored on peers of the data cluster, and within each, cycling through a read of all the data blocks of the file. The sequences can be controlled by the data cluster gateway, or by a higher level gateway in the HSC, or even by a client. The action of reading a block causes it to be regenerated if necessary as described in the data retrieval description above. The regenerated blocks are multicast to all the peers in the cluster and the peers being healed store them, thereby healing themselves. When the count of peer failures exceeds the cluster group FEC, the checksum clusters rotationally tasked with repairs of this codeword will regenerate the blocks on the failed peers as described in the data retrieval description above. The checksum clusters of the cluster group need not be updated because they continued to be updated correctly when the data changed, despite the peer failures as described in the data write description above.

Checksum clusters 230 also heal themselves in the present embodiment. Healing of these clusters, too, proceeds on a per-checksum cluster basis.

Healing of checksum clusters, where the count of failed peers being healed is no greater than the FEC level, is the same as healing of data clusters. Regenerated blocks are multicast to the current checksum cluster and the peers in the checksum cluster being healed store them, thereby healing themselves. When the count of peer failures exceeds the cluster group FEC, the checksum clusters regenerate the blocks on the failed peers as described in the data reading description above. Reading the corresponding horizontal stripe across the data clusters regenerates the blocks on the checksum cluster peers being healed. If some data clusters have peer failures, their missing blocks will be regenerated with the help of additional checksum clusters in the cluster group.

Description of Cluster Hierarchy

The peers in the clusters have their own local persistent storage media in which data is written and from which data is read. The storage media can include disk drives, SSD's, and any hardware that is accessed by the peer's operating system as a file system or device mount point. Such hardware can have large but finite storage capacity, as there are physical limits to the count of devices that can be contained within a peer or attached to a peer.

Each peer also can mount a cluster of its own for local data storage thereby creating a cluster hierarchy. The peers can mount data clusters, cluster groups or an entire Hyper Storage cluster. Because all three cluster types are accessed through the filesystem as a local file system mount point (i.e. a local storage), the peers in these clusters need not be aware that they are mounted a cluster or make special accommodations. In such a cluster hierarchy, the peers are not limited to the capacity of their available physical storage hardware. Instead of a peer having only a few terabytes of local storage capacity, each peer can have petabytes of cluster capacity.

The cluster hierarchy permits added performance and resiliency. Locally mounted storage hardware devices are few in number, which limits performance and capacity, and require a mechanism such as RAID for limited resiliency. Mounting a cluster provides the peer with access to thousands of disk drives with vast capacity and very high resiliency as described elsewhere herein.

Localized Data Placement and Hyper Computing

In applications that involve processing many petabytes of data, it is common to spread the workload among thousands of computers. Each of the computers is then tasked with processing a fraction of the data. For performance requirements the many petabytes of data typically cannot be stored in a central location shared by the thousands of computers, as bringing the data to the computers would overwhelm any single storage system. One solution is to distribute the petabytes in chunks of data for storage across the thousands of computers for processing in parallel. This way the application programs are brought to the data, instead of the data being brought to the application programs, as each computer processes the chunks of data that it stores locally.

An aspect of the present invention offers a way to localize chunks of data at the specific peers that are to process them. At the same time, excellent cluster-wide and cluster-group-wide resiliency of the data is maintained. As described earlier, when writing data to a Data Cluster, embodiments of the present invention will rotationally disperse the data to be written as blocks of uniform size across the cluster vertically, thereby forming codewords that include the data and the corresponding checksum symbols (FIG. 3). Embodiments of the invention further disperse the data across Data Clusters in a Cluster Group and/or across Cluster Groups in a Hyper Storage Cluster, but for purposes of the present discussion dispersal across the peers of only a single Data Cluster is considered. For purposes of localizing a chunk of data of arbitrary size, an embodiment of the present invention optionally allows the client to specify a target peer on which the data is to be held. In this case all of the data to write is positioned within the local stripe file of the target peer along consecutive ISS blocks. See, for example, FIG. 13, where all of the user data (the ISS blocks) are stored in the stripe file of Peer 4, none in any of the other peers in the Data Cluster. However, as rotationally indicated, all the peers in the Data Cluster including the target peer do generate checksum symbols as described elsewhere herein in order to preserve the resiliency of the data in the cluster. The target peer stores the entire chunk of data locally and, by installing and executing software on that peer, it can process its locally stored data chunk independently of any other peer and in parallel with all the other peers thus achieving the highest level of performance while preserving the data resiliency without replication. As illustrated in FIG. 13, each row represents a stripe file stored on the indicated peer. By specifying different target peers it is possible to disperse the many petabytes of data across the cluster and to preserve its resiliency while localizing chunks of data within each peer for local processing.

In embodiments in which data is to be dispersed across Data Clusters in a Cluster Group and/or across Cluster Groups in a Hyper Storage Cluster, the data write requests specify the Data Cluster number and/or the Cluster Group number (as appropriate), in addition to specifying the target peer number on which the data chunk is to be stored. The data is then written to the specified Cluster Group number/Data Cluster number/target peer number in the manner set forth elsewhere herein.

Peers which are performing processing of data stored locally access their data independently of the cluster using a Local Stripe File System (LSFS). Like the filesystem via which data in the data cluster is accessed externally, the LSFS opens the specified stripe file on the peer computer and reads the HMF header to determine how the contents of the file are organized. Stripe files include user data blocks (ISS) and generated checksum blocks (CSS) as represented by each row in FIG. 13. The LSFS navigates the sequence of ISS and CSS blocks, as the physical ordering of the blocks does not necessarily match their logical ordering. For example, referring to FIG. 13, an application on Peer 4 that requests four blocks starting a location 0 would receive from the LSFS the blocks ISS1, ISS2, ISS3 and ISS4, which is what it expects. The LSFS knows to skip CSS1 and CSS2, as these blocks do not contain user data that the application expects. If the application bypasses the LSFS and tries to naively directly read the first four blocks it would get ISS1, CSS1, ISS2 and CSS2, which is not what it expects.

Resilient Data Placement

An aspect of the present invention also provides a mechanism for the resiliency of the user data generated by the applications running on the peers. Applications running on peers produce data as part of their processing their local user data through the LSFS. This data can be made resilient by making it part of the cluster rather than just the peers that produced it. This is accomplished through a Remote Stripe File System (RSFS). The RSFS is a networked file system that extends the POSI/X standard interface by adding read and write functions that specify a target stripe. An application that produces data can write this data to the cluster through the RSFS rather than just locally to ensure the resiliency of the data. The application can specify its own peer as the target stripe thereby ensuring the locality of its data for efficient further processing. In this case the data will be striped as illustrated in FIG. 13. If the application does not specify a target stripe the data will be striped across all peers in the data cluster (or across data clusters or across cluster groups). Through the RSFS it is possible for an application to specify any cluster peer as the target, even a failed peer, and not just the local peer. This allows related data to be aggregated for storage on a specific peer so that it can subsequently be processed locally through the LSFS.

Additional Notes

As used herein, language such as "first" input symbol segment, first block, first peer, and first data cluster, all use the term "first" only as a handle. The term does not imply that the item is in any sense sequentially first.

When a smaller unit is said herein to do something, each larger unit that contains it is said to do it as well. For example, if a particular peer does something, the storage cluster, the cluster group and the entire HSC containing that peer can be said to do it as well. When a larger unit is said to perform an operation, that by itself does not imply which if any of the smaller contained units actually perform the operation. Thus when a cluster is said to perform an operation, it may actually be performed by one of the peers in the cluster, or by more than one of the peers in the cluster (possibly acting individually or together), or by some component that is common to all the peers in the cluster but not strictly part of any given peer. Sometimes other language restricts which if any contained component performs the operation.

As used herein, a given signal, event or value is "responsive" to a predecessor signal, event or value if the predecessor signal, event or value influenced the given signal, event or value. If there is an intervening processing element, step or time period, the given signal, event or value can still be "responsive" to the predecessor signal, event or value. If the intervening processing element or step combines more than one signal, event or value, the signal output of the processing element or step is considered "responsive" to each of the signal, event or value inputs. If the given signal, event or value is the same as the predecessor signal, event or value, this is merely a degenerate case in which the given signal, event or value is still considered to be "responsive" to the predecessor signal, event or value. "Dependency" of a given signal, event or value upon another signal, event or value is defined similarly.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method of storing data in a clustered data processing system, for use with a first cluster group having a set of M data clusters and a set of K checksum clusters, each cluster having P peer computer systems, a particular one of the data clusters having forward error protection against a desired integer number F simultaneous peer failures, where M is an integer greater than 1, K is an integer greater than zero, P is an integer greater than 1, and $0<F<P$, comprising:

the first cluster group receiving a first data segment for storage in a first block of a peer p of a particular one of the data clusters;

if peer p of the particular data cluster is available:
   all available peers in the particular data cluster which are responsible for storing vertical checksum data covering the first block of peer p of the particular data cluster updating prior vertical checksum data in dependence upon the received first data segment, and storing the received first data segment in peer p of the particular data cluster;

transmitting horizontally toward the checksum clusters, prior data of the first block of peer p of the particular data cluster or stored data covered by a horizontal checksum which also covers the prior data of the first block of peer p of the first data cluster;

each available peer q in the checksum clusters which is responsible for storing horizontal checksum data covering the first block of peer p of the particular data cluster:
   determining that peer q is responsible for storing horizontal checksum data covering the first block of peer p of the particular data cluster; and
   updating peer q's prior horizontal checksum data in dependence upon the received first data segment and the data transmitted horizontally toward the checksum clusters.

2. The method of claim 1, wherein peer p of the particular data cluster is unavailable,
   wherein transmitting horizontally toward the checksum clusters comprises:
   the particular data cluster regenerating the prior data of the first block of peer p of the first data cluster; and
   the particular data cluster transmitting the regenerated prior data horizontally toward the checksum clusters.

3. The method of claim 2, further comprising:
   the first cluster group receiving a first content request for delivery of a requested data segment to a retrieval destination, the requested data segment including at least part of the first data segment;
   the checksum clusters determining that peer p in the particular data cluster has responsibility for storing the requested data, that peer p in the particular data cluster is unavailable, and that the particular data cluster has more peers unavailable than F; and the checksum clusters regenerating the requested data segment in dependence upon the horizontal checksum data updated in the step of each available peer q in the checksum clusters updating peer q's prior horizontal checksum data; and transmitting the regenerated requested data segment toward the retrieval destination.

4. The method of claim 3, wherein peer p of the particular data cluster is unavailable and the particular data cluster has more peers unavailable than F, further comprising each available peer p in the data clusters, which peer has stored data covered by a horizontal checksum which also covers the prior data of the first block of peer p of the first data cluster, determining that peer p of the particular data cluster is unavailable and the particular data cluster has more peers unavailable than F, and wherein transmitting horizontally toward the checksum clusters comprises all available peers p in the data clusters, which peers have respective stored data covered by a horizontal checksum which also covers the prior data of the first block of peer p of the first data cluster transmitting their respective stored data horizontally toward the checksum clusters.

5. The method of claim 4, where K>1, further comprising:

each available peer r in the checksum clusters which is responsible for storing horizontal checksum data covering the first block of peer p of the particular data cluster determining that peer r is responsible for storing horizontal checksum data covering the first block of peer p of the particular data cluster, and wherein transmitting horizontally toward the checksum clusters further includes all available peers in the checksum clusters which are responsible for storing respective horizontal checksum data covering the first block of peer p of the particular data cluster transmitting the respective horizontal checksum data.

6. The method of claim 1, further comprising:

each of the checksum clusters updating prior vertical checksum data in response to and in dependence upon any horizontal checksum data updated in the step of each available peer q in the checksum clusters updating peer q's prior horizontal checksum data.

7. The method of claim 1, for use with a number G of cluster groups including the first cluster group, where G is an integer greater than 1, further comprising, in response to a gateway system receiving write data from a client system, the write data including data to be stored in a plurality of the cluster groups including the first cluster group:

the gateway system dividing the write data into a plurality of data segments each destined for storage in a single one of the cluster groups, including the first data segment covering data for storage in the first cluster group; and forwarding each given one of the data segments toward the cluster group destined for storing the given data segment.

8. The method of claim 1, for use with a number G of cluster groups including the first cluster group, where G is an integer greater than 1, further comprising:

a gateway system receiving write data from a client system in conjunction with an indication that the write data should be stored in the first cluster group, the write data including the first data segment; and the gateway system forwarding the write data toward the first cluster group.

9. The method of claim 8, wherein the gateway system receives the write data in further conjunction with an indication that the write data should be stored in data cluster #m of the first cluster group, and wherein the gateway system forwarding the write data toward the first cluster group includes the gateway system forwarding the write data toward the first cluster group in conjunction with an indication that the write data should be stored in data cluster #m of the first cluster group.

10. The method of claim 9, wherein the gateway system receives the write data in further conjunction with an indication that the write data should be stored in peer p of data cluster #m of the first cluster group, and wherein the gateway system forwarding the write data toward the first cluster group includes the gateway system forwarding the write data toward the first cluster group in further conjunction with an indication that the write data should be stored in peer p of data cluster #m of the first cluster group.

11. The method of claim 1, wherein the first cluster group receiving a first data segment for storage in a first block of a peer p of a particular one of the data clusters comprises the first cluster group receiving the first data segment in conjunction with an indication of the destination data cluster #m and the destination peer p in data cluster #m.

12. The method of claim 1, wherein each of the data clusters has forward error protection against F simultaneous peer failures.

13. A method of retrieving data in a clustered data processing system, for use with a first cluster group having a set of M data clusters and a set of K clusters, each cluster having P peer computer systems, a particular one of the data clusters having forward error protection against F simultaneous peer failures, where M is an integer greater than 1, K is an integer greater than zero, P is an integer greater than 1, and 0<F<P, comprising:

the first cluster group receiving a first content request for delivery of data to a retrieval destination, the first content request covering a requested data segment for which a peer p in the particular data cluster has responsibility to store;

in response to the particular data cluster determining that peer p in the particular data clusters unavailable, but that the total number of unavailable peers in the particular data cluster is no more than F, the particular data cluster regenerating the requested data segment and transmitting the requested data segment toward the retrieval destination; and in response to the checksum clusters determining that the peer p in the particular data cluster is unavailable, and that the particular data cluster has more peers unavailable than F, the checksum clusters regenerating the requested data segment and transmitting the requested data segment toward the retrieval destination.

14. The method of claim 13, further comprising, in response to the data clusters determining that the peer p in the particular data cluster is unavailable, and that the particular data cluster has more peers unavailable than F, all available peers p in the data clusters, which peers have stored data for regenerating the requested data segment, transmitting such stored data toward the checksum clusters.

15. The method of claim 14, wherein the data clusters determining that the peer p in the particular data cluster is unavailable, and that the particular data cluster has more peers unavailable than F, comprises each of the available peer p in the data clusters, which peers have stored data for regenerating the requested data segment, determining that peer p in the particular data cluster is unavailable, and that the particular data cluster has more peers unavailable than F.

16. The method of claim 13, wherein the checksum clusters regenerating the requested data segment and transmitting the requested data segment toward the retrieval destination comprises:
   the checksum clusters determining that the number of missing data segments horizontally is a number fh, where fh≤K; and
   fh−1 of the checksum clusters transmitting checksum segments horizontally toward a checksum cluster responsible for regenerating the requested data segment.

17. The method of claim 16, wherein the checksum clusters determining that the number of missing data segments horizontally is a number fh comprises each available peer p in each of the checksum clusters determining that the number of missing data segments horizontally is fh.

18. The method of claim 13, where K>1,
   and wherein each given available peer p in each of the checksum clusters determines whether the given peer p in the checksum cluster is responsible for regenerating the requested data segment, and whether the given peer p in the checksum cluster is responsible for transmitting checksum segments horizontally.

19. The method of claim 13, wherein the checksum clusters regenerating the requested data and transmitting the requested data segment toward the retrieval destination comprises:
   determining that a k'th one of the checksum clusters has responsibility to regenerate the requested data segment in peer p in the particular data cluster; and
   the k'th checksum cluster regenerating the requested data segment and transmitting the requested data segment toward the retrieval destination.

20. The method of claim 19, wherein peer p in the k'th checksum cluster is available,
   and wherein the k'th checksum cluster regenerating the requested data segment and transmitting the requested data segment toward the retrieval destination comprises peer p in the k'th checksum cluster regenerating the requested data segment and transmitting the requested data segment toward the retrieval destination.

21. The method of claim 20, further comprising peer p in the k'th checksum cluster making a determination that that the particular data cluster will not be returning the requested data, and that peer p in the k'th checksum cluster has responsibility to regenerate the requested data segment and transmitting the requested data segment toward the retrieval destination.

22. The method of claim 13, for use with a number G of cluster groups including the first cluster group, where G is an integer greater than 1, further comprising, in response to a gateway system receiving a data retrieval request from a data requestor, the data retrieval request covering data stored in a plurality of the cluster groups including the first cluster group:
   the gateway system dividing the data retrieval request into a plurality of content requests each covering data stored in a single one of the cluster groups, including the first content request covering data stored in the first cluster group; and
   forwarding each given one of the content requests toward the cluster group storing the data covered by the given content request.

23. The method of claim 13, wherein each of the data clusters has forward error protection against F simultaneous peer failures.

* * * * *